(12) United States Patent
Kim et al.

(10) Patent No.: US 11,074,866 B2
(45) Date of Patent: Jul. 27, 2021

(54) LIGHT EMITTING DISPLAY APPARATUS

(71) Applicant: LG Display Co., Ltd., Seoul (KR)

(72) Inventors: Kyung-Rok Kim, Osan-si (KR); Kimin Son, Osan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/222,969

(22) Filed: Dec. 17, 2018

(65) Prior Publication Data
US 2019/0206333 A1    Jul. 4, 2019

(30) Foreign Application Priority Data

Dec. 29, 2017  (KR) .................. 10-2017-0184835

(51) Int. Cl.
*G09G 3/3275* (2016.01)
*G09G 3/32* (2016.01)
*G09G 3/3266* (2016.01)
*H01L 23/00* (2006.01)
*H01L 27/12* (2006.01)
(Continued)

(52) U.S. Cl.
CPC ......... *G09G 3/3275* (2013.01); *G06F 3/0412* (2013.01); *G06F 3/04164* (2019.05); *G09G 3/32* (2013.01); *H01L 24/16* (2013.01); *H01L 27/124* (2013.01); *H01L 27/1248* (2013.01); *H01L 27/32* (2013.01); *G09G 2300/0408* (2013.01); *G09G 2310/027* (2013.01); *G09G 2310/0286* (2013.01); *G09G 2310/0291* (2013.01); *G09G 2310/06* (2013.01); *G09G 2310/08* (2013.01); *H01L 27/3246* (2013.01); *H01L 27/3258* (2013.01); *H01L 27/3276* (2013.01); *H01L 2224/16225* (2013.01)

(58) Field of Classification Search
CPC ... G09G 2310/0286; G09G 2310/0267; G09G 2310/0283; G09G 2310/0291; G09G 2310/0264; G09G 2310/08; G09G 3/3266; G09G 3/3677; G09G 3/32; G09G 3/3275; G09G 2300/0408; G06F 3/0416; G06F 3/0412; G06F 3/04164; H01L 24/16

See application file for complete search history.

(56) References Cited

U.S. PATENT DOCUMENTS 7,777,713 B2 *  8/2010  Hashimoto .......... G09G 3/3688
                                                      345/100
9,343,027 B2 *  5/2016  Zhu ......................... G09G 3/20
(Continued)

FOREIGN PATENT DOCUMENTS

CN           104200772 A        12/2014

*Primary Examiner* — Dismery Mercedes
(74) *Attorney, Agent, or Firm* — Polsinelli PC

(57) ABSTRACT

The light emitting display apparatus includes a substrate including a display area including a plurality of pixel areas and a non-display area surrounding the display area, a plurality of gate lines passing through the display area of the substrate, a plurality of data lines passing through the display area of the substrate, a plurality of pixel driving power lines passing through the display area of the substrate, a plurality of pixels respectively provided in the plurality of pixel areas of the substrate and connected to an adjacent gate line, an adjacent data line, and an adjacent pixel driving power line, and a gate buffer provided in the display area of the substrate and connected to a corresponding gate line of the plurality of gate lines.

23 Claims, 13 Drawing Sheets

(51) Int. Cl.
  *H01L 27/32* (2006.01)
  *G06F 3/041* (2006.01)

(56) References Cited

U.S. PATENT DOCUMENTS

| | | | |
|---|---|---|---|
| 10,235,938 B2* | 3/2019 | Takahara | G09G 3/3266 |
| 10,818,241 B2* | 10/2020 | Kim | G09G 3/32 |
| 2006/0233003 A1* | 10/2006 | Iwanaga | G09G 3/20 |
| | | | 365/1 |
| 2010/0053060 A1* | 3/2010 | Wu | G09G 3/36 |
| | | | 345/99 |
| 2012/0242708 A1* | 9/2012 | Tsai | H01L 27/326 |
| | | | 345/690 |
| 2013/0307885 A1* | 11/2013 | Shin | G09G 3/3266 |
| | | | 345/691 |
| 2014/0028534 A1* | 1/2014 | Park | G09G 3/20 |
| | | | 345/84 |
| 2015/0179724 A1* | 6/2015 | Lee | H01L 29/7869 |
| | | | 257/40 |
| 2015/0262528 A1* | 9/2015 | Takahara | G09G 3/3258 |
| | | | 345/212 |
| 2016/0171933 A1* | 6/2016 | Takahara | G09G 3/3233 |
| | | | 345/212 |
| 2017/0039974 A1* | 2/2017 | Kang | G09G 3/20 |
| 2017/0076663 A1* | 3/2017 | Nishimura | G09G 3/3225 |
| 2018/0090087 A1* | 3/2018 | Shi | G09G 3/3648 |
| 2018/0149901 A1* | 5/2018 | Park | H05K 3/321 |
| 2018/0218668 A1* | 8/2018 | Aoyagi | G09G 3/32 |
| 2019/0096864 A1* | 3/2019 | Huitema | H01L 24/82 |
| 2019/0147800 A1* | 5/2019 | Bae | G09G 3/3666 |
| | | | 345/173 |

\* cited by examiner

LIGHT EMITTING DISPLAY APPARATUS

CROSS REFERENCE TO RELATED APPLICATION

This application claims the benefit of the Korean Patent Application No. 10-2017-0184835 filed on Dec. 29, 2017, which is hereby incorporated by reference in its entirety as if fully set forth herein.

BACKGROUND

Field of the Disclosure

The present disclosure relates to a display device, and more particularly, to a light emitting display apparatus. Although the present disclosure is suitable for a wide scope of applications, it is particularly suitable for preventing a luminance deviation between a left portion and a right portion of a display panel of the light emitting display apparatus.

Description of the Background

Recently, with the advancement of multimedia, the importance of display apparatuses is increasing. Therefore, flat panel display apparatuses such as liquid crystal display (LCD) apparatuses, organic light emitting display apparatuses, and light emitting diode display apparatuses have been commercialized. The LCD apparatuses and the organic light emitting display apparatuses among the flat panel display apparatuses have good characteristics such as thinness, lightness, and low power consumption, and thus, are being widely used as a display screen for televisions (TVs), notebook computers, and monitors as well as portable electronic devices such as electronic notebooks, e-books, portable multimedia players (PMPs), navigation devices, ultra-mobile personal computers (PCs), mobile phones, smartphones, smartwatches, tablet personal computers (PCs), watch phones, and mobile communication terminals.

A related art light emitting display apparatus includes a display panel that includes a plurality of data lines, a plurality of gate lines, and a plurality of pixels connected to a corresponding data line and a corresponding scan line, a data driving circuit that supplies data signals to the data lines, and a gate driving circuit that supplies a gate signal to the plurality of gate lines. Also, each of the plurality of pixels is supplied with a data signal supplied through a corresponding data line from the data driving circuit in synchronization with the gate signal supplied through a corresponding gate line from the gate driving circuit, thereby displaying an image corresponding to the data signal.

In the display panel of the related art light emitting display apparatus, the plurality of pixels are driven by the data driving circuit and the gate driving circuit, but falling times, by positions of the gate line, of the gate pulse applied to the gate line vary based on an RC load. Due to this, image quality is degraded due to a luminance deviation between a left portion and a right portion of the display panel. Also, in a light emitting display apparatus including a display panel having a high resolution and a large area, since the RC load applied to the gate line more increases due to an increase in a length of the gate line, image quality is more degraded due to a luminance deviation between a left portion and a right portion of the display panel.

SUMMARY

Accordingly, the present disclosure is directed to providing a light emitting display apparatus that substantially obviates one or more problems due to limitations and disadvantages of the related art.

An aspect of the present disclosure is directed to providing a light emitting display apparatus which includes at least one gate buffer chip connected to a gate line, and thus, buffers a gate pulse to remove a deviation of a falling time regardless of a distance between a gate driving circuit and the gate line, thereby preventing the occurrence of a luminance deviation between a left portion and a right portion of a display panel.

Another aspect of the present disclosure is directed to providing a light emitting display apparatus which includes at least one gate buffer chip having a minimized size, and thus, minimizes a bezel area of a display panel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display apparatus including a substrate including a display area including a plurality of pixel areas and a non-display area surrounding the display area, a plurality of gate lines passing through the display area of the substrate, a plurality of data lines passing through the display area of the substrate, a plurality of pixel driving power lines passing through the display area of the substrate, a plurality of pixels respectively provided in the plurality of pixel areas of the substrate and connected to an adjacent gate line, an adjacent data line, and an adjacent pixel driving power line, and a gate buffer provided in the display area of the substrate and connected to a corresponding gate line of the plurality of gate lines.

In another aspect of the present disclosure, a light emitting display apparatus a substrate including a display area where a plurality of pixel areas is located and a non-display area surrounding the display area, includes a pixel driving chip connected to an adjacent gate line, an adjacent data line, and an adjacent pixel driving power line; a light emitting device connected to the pixel driving chip; a plurality of gate lines passing through the display area; a plurality of data lines passing through the display area; a plurality of pixel driving power lines passing through the display area; a plurality of pixels disposed in the plurality of pixel areas and connected to an adjacent gate line, an adjacent data line, and an adjacent pixel driving power line; and a gate buffer chip embedded in the pixel driving chip and connected to a corresponding gate line of the plurality of gate lines.

Details of other aspects are included in the detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION OF THE DISCLOSURE

Figure 1:
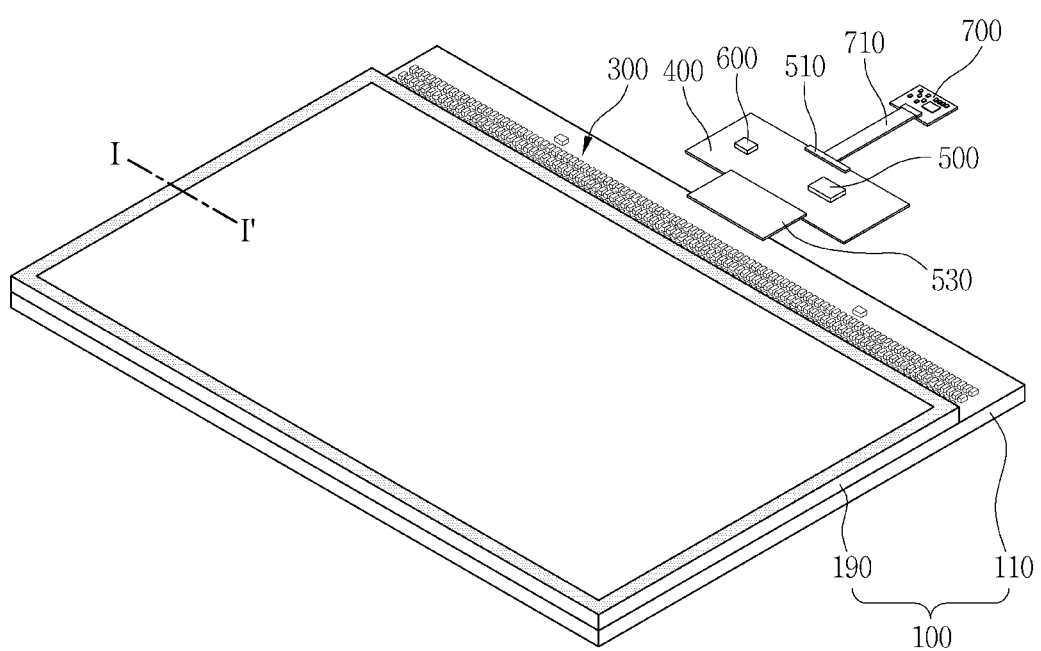
FIG. 1 is a diagram illustrating a light emitting display apparatus according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of the present disclosure will be described in detail with reference to the accompanying drawings.

Figure 2:
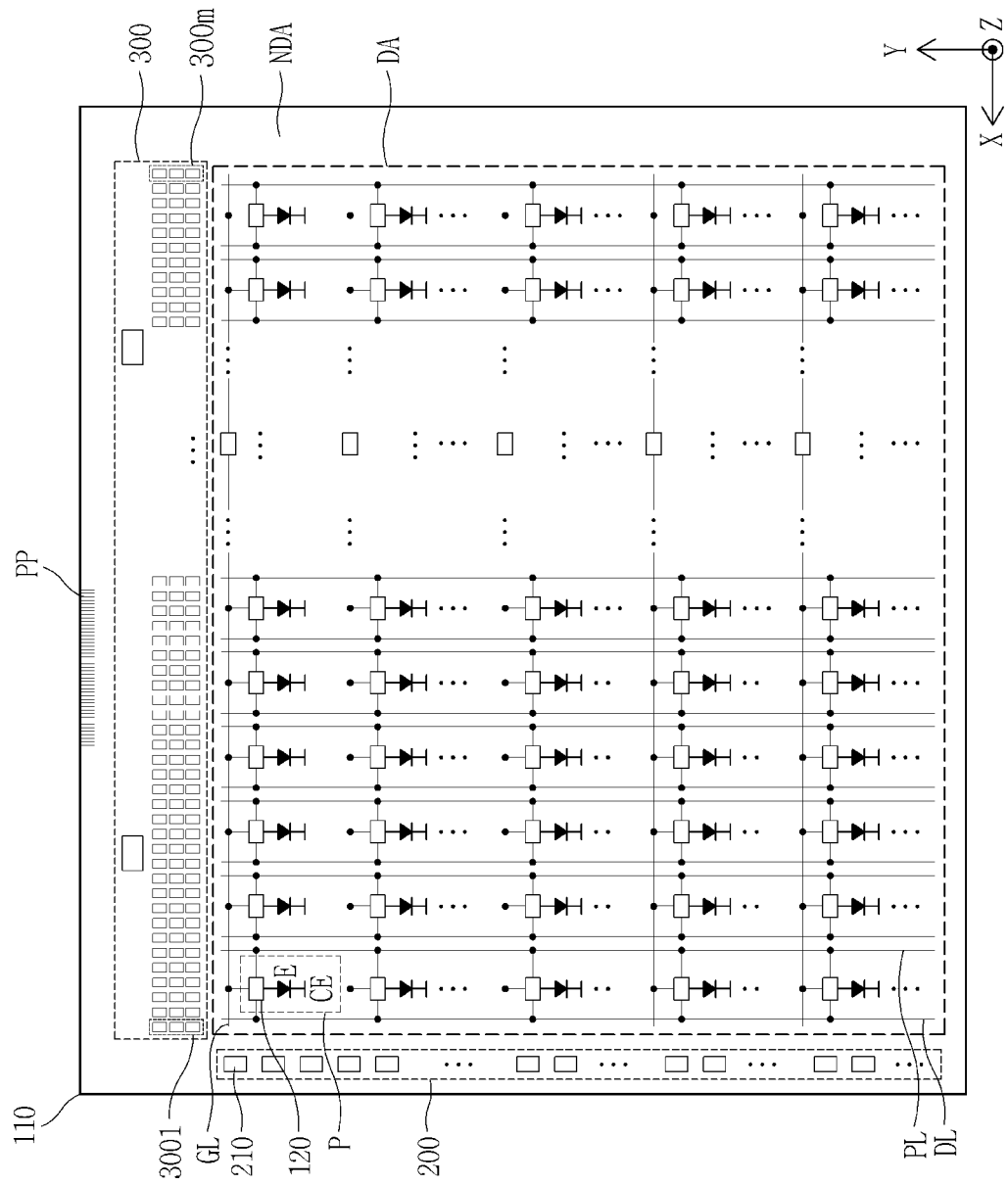
FIG. 2 is a plan view illustrating a substrate illustrated in FIG. 1.
Figure 3:
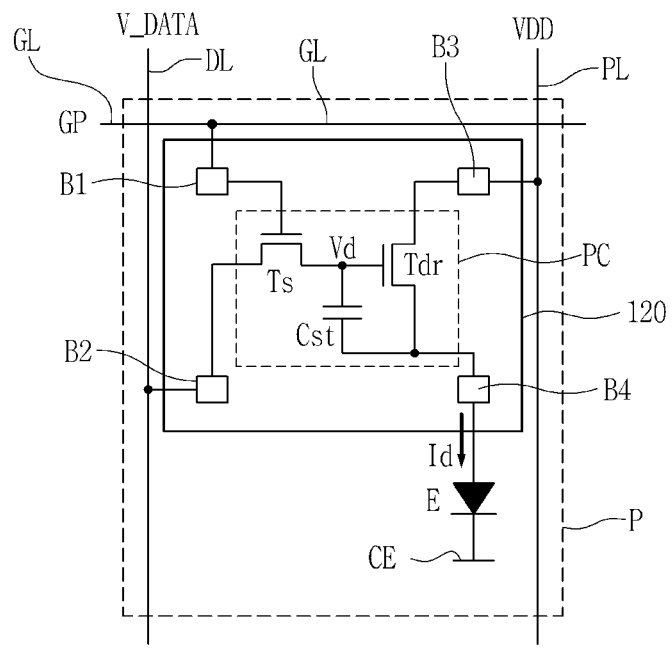
FIG. 3 is a diagram illustrating one pixel illustrated in FIG. 2.

FIG. 1 is a diagram illustrating a light emitting display apparatus according to an aspect of the present disclosure. FIG. 2 is a plan view illustrating a substrate illustrated in FIG. 1. FIG. 3 is a diagram illustrating one pixel illustrated in FIG. 2.

Referring to FIGS. 1 to 3, the display apparatus according to an aspect of the present disclosure may include a display panel 100, and a gate driving chip array part 200 and a data driving chip array part 300 mounted on the display panel 100.

The display panel 100 may include a substrate 110 and an opposite substrate 190, which face each other. Here, the substrate 110 may be a pixel array substrate, and the opposite substrate 190 may be a color filter array substrate including a color filter. Also, the substrate 110 may have a size which is larger than that of the opposite substrate 190, and thus, one edge of the substrate 110 may be exposed without being covered by the opposite substrate 190.

The substrate 110, a base substrate, may be formed of an insulating material such as glass, quartz, ceramic, or plastic. For example, the substrate 110 including plastic may be a polyimide film, and particularly, may be a heat-resistant polyimide film capable of enduring a high temperature in a high temperature deposition process. The substrate 110 may include a display area DA including a plurality of pixel areas and a non-display area NDA. The display area DA may be defined as an area which displays an image, and the non-display area NDA may be an area which does not display an image and may be defined in an edge of the substrate 110 to surround the display area DA.

According to an aspect, the substrate 110 may include first to $n^{th}$ gate lines GL passing through the display area DA in a first direction X and first to $m^{th}$ data lines DL passing through the display area DA in a second direction Y intersecting the first direction X. Also, the substrate 110 may include first to $m^{th}$ pixel driving power lines PL arranged in parallel to the first to $m^{th}$ data lines DL. The first to $n^{th}$ gate lines GL and the first to $m^{th}$ data lines DL may intersect one another to define a plurality of pixel areas in the display area DA.

According to an aspect, the substrate 110 may include a plurality of pixels P for displaying an image. The plurality of pixels P may each include a pixel driving chip 120 and a plurality of light emitting devices E.

The pixel driving chip 120 may be provided in each of the plurality of pixel areas, connected to an adjacent gate line GL, an adjacent data line DL, and an adjacent pixel driving power line PL, and connected to the light emitting devices E. According to an aspect, the pixel driving chip 120 may be a minimum-unit microchip or one chipset and may be a semiconductor packaging device which includes two or more transistors and one or more capacitors and has a fine size. Each of a plurality of pixel driving chips 120 may control light emission of the light emitting device E by supplying, to the light emitting device E, a driving current Id corresponding to a data voltage V_DATA supplied through the data line DL in response to a gate pulse GP supplied through the gate line GL, based on a pixel driving voltage VDD supplied through the pixel driving power line PL.

According to an aspect, each of the plurality of pixel driving chips 120 may include first to fourth bumps B1 to B4 and a pixel driving circuit PC.

The first bump B1 (or a gate bump) may be electrically connected to an adjacent gate line GL to receive a gate pulse GP through the gate line GL. The second bump B2 (or a data bump) may be electrically connected to an adjacent data line DL to receive the data voltage V_DATA through the data line DL. The third bump B3 (or a power input bump) may be electrically connected to an adjacent pixel driving power line PL and may be supplied with the pixel driving voltage VDD through the pixel driving power line PL. The fourth bump B4 (or an output bump) may be electrically connected to the light emitting device E to supply a data current to the light emitting device E.

The pixel driving circuit PC may be connected to the first to fourth bumps B1 to B4 and may output, to the fourth bump B4, a data current corresponding to the data voltage V_DATA supplied through the second bump B2 in response to the gate pulse GP supplied through the first bump B1, based on the pixel driving voltage VDD supplied through the third bump B3.

According to an aspect, the pixel driving circuit PC (or an internal pixel driving circuit) may include a switching transistor Ts, a driving transistor Tdr, and a capacitor Cst.

The switching transistor Ts may include a gate electrode connected to the first bump B1, a first source/drain electrode connected to the second bump B2, and second source/drain electrodes connected to a gate electrode of the driving transistor Tdr. Here, each of the first and second source/drain electrodes of the switching transistor Ts may be a source electrode or a drain electrode, based on a direction of a current. The switching transistor Ts may be turned on according to the gate pulse GP supplied through the first bump B1 and may transfer the data voltage V_DATA, supplied through the second bump B2, to the driving transistor Tdr.

The driving transistor Tdr may include a gate electrode connected to second source/drain electrodes of the switching transistor Ts, a drain electrode supplied with the pixel driving voltage VDD through the third bump B3, and a source electrode connected to the fourth bump B4. The driving transistor Tdr may control a data current Id flowing from the third bump B3 to the light emitting device E through the fourth bump B4 to control light emission of the light emitting device E, based on the data voltage V_DATA transferred from the switching transistor Ts.

The capacitor Cst may be provided in an overlap region between the gate electrode and the source electrode of the driving transistor Tdr. The capacitor Cst may store the driving voltage Vd supplied to the gate electrode of the driving transistor Tdr and may turn on the driving transistor Tdr with the stored driving voltage Vd.

Optionally, the pixel driving circuit PC may further include at least one compensation thin film transistor (TFT) for compensating for a shift of a threshold voltage of the driving transistor Tdr, and moreover, may further include at least one auxiliary capacitor. According to an aspect, the pixel driving circuit PC may be additionally supplied with a compensation voltage such as an initialization voltage, based on the number of TFTs and the number of auxiliary capacitors. Accordingly, the pixel driving circuit PC may be changed to a pixel driving circuit PC, allowing the light emitting device E to emit light through a current driving manner, of a light emitting display apparatus well known to those skilled in the art. In this case, each of the plurality of pixel driving chips 120 may further include at least one terminal (or bump), based on the number of TFTs of the pixel driving circuits PC and the number of power sources. In addition, a power line corresponding to the pixel driving voltage VDD may be additionally displayed on the substrate 110.

The plurality of light emitting devices E may emit lights with the driving current Id supplied from the pixel driving chip 120. According to an aspect, the lights emitted from the plurality of light emitting devices E may be output to the outside through the opposite substrate 190, or may be output to the outside through the substrate 110.

According to an aspect, the plurality of light emitting devices E may include an anode electrode (or a first electrode) connected to a corresponding pixel driving chip 120, a light emitting layer connected to the anode electrode, and a cathode electrode (or a second electrode) CE connected to the light emitting layer. The light emitting layer may include one of an organic light emitting layer, an inorganic light emitting layer, and a quantum dot light emitting layer, or may include a stacked or mixed structure including an organic light emitting layer (or an inorganic light emitting layer) and a quantum dot light emitting layer.

The opposite substrate 190 may cover the plurality of pixels P provided on the substrate 110. For example, the opposite substrate 190 may be a glass substrate, a flexible substrate, a plastic film, or the like. Also, the opposite substrate 190 may be a polyethylene terephthalate film, a polyimide film, or the like. The opposite substrate 190 may be bonded to the substrate 110 by a transparent adhesive layer.

The light emitting device E may emit light with the driving current Id supplied from the pixel driving chip 120. The light emitted from the light emitting device E may be emitted to the outside through the opposite substrate 190 or the substrate 110.

According to an aspect, the light emitting device E may include an anode electrode (or a first electrode) connected to the fourth bump B4 of the pixel driving chip 120, a light emitting layer connected to the anode electrode, and a cathode electrode (or a second electrode) CE connected to the light emitting layer. The light emitting layer may include one of an organic light emitting layer, an inorganic light emitting layer, and a quantum dot light emitting layer, or may include a stacked or mixed structure including an organic light emitting layer (or an inorganic light emitting layer) and a quantum dot light emitting layer.

The opposite substrate 190 may cover the plurality of pixels P provided on the substrate 110. For example, the opposite substrate 190 may be a glass substrate, a flexible substrate, a plastic film, or the like. For example, the opposite substrate 190 may be a polyethylene terephthalate film, a transparent polyimide film, or the like. The opposite substrate 190 may be bonded to the substrate 110 by a transparent adhesive layer.

The gate driving chip array part 200 may be provided in the non-display area NDA of the substrate 110 and may be connected to the first to $n^{th}$ gate lines GL. The gate driving chip array part 200 may sequentially supply the gate pulse GP to the first to $n^{th}$ gate lines GL in response to a reference clock signal and a gate start signal supplied through a pad part PP disposed in a first non-display area (or an upper non-display area) of the substrate 110. For example, the gate driving chip array part 200 may include first to $n^{th}$ gate driving chips 210 respectively connected to the first to $n^{th}$ gate lines GL.

According to an aspect, the gate driving chip array part 200 may be provided in a second non-display area (or a left non-display area) or a third non-display area (or a right non-display area) of the substrate 110 and may operate in a single feeding manner to sequentially supply the gate pulse GP to the first to $n^{th}$ gate lines GL.

According to another aspect, the gate driving chip array part 200 may be provided in the second non-display area (or the left non-display area) or the third non-display area (or the right non-display area) of the substrate 110 and may operate in a double feeding manner to sequentially supply the gate pulse GP to the first to $n^{th}$ gate lines GL.

According to another aspect, the gate driving chip array part 200 may be provided in the second non-display area (or the left non-display area) or the third non-display area (or the right non-display area) of the substrate 110 and may operate in an double feeding-based interlacing manner to sequentially supply the gate pulse GP to the first to $n^{th}$ gate lines GL.

The data driving chip array part 300 may be provided in the non-display area NDA of the substrate 110 and may be connected to the first to $m^{th}$ data lines DL. In detail, the data driving chip array part 300 may convert a data signal, supplied through the pad part PP disposed in the first non-display area (or the upper non-display area) of the substrate 110, into a data voltage and may supply the data voltage to a corresponding data line of the first to $m^{th}$ data lines DL. For example, the data driving chip array part 300 may include a plurality of data driving chips for respectively supplying data voltages to the first to $m^{th}$ data lines DL.

According to an aspect, the light emitting display apparatus may further include a control board 400, a timing controller 500, a power management circuit 600, and a display driving system 700.

The control board 400 may be connected to, through a signal cable 530, the pad part PP disposed in one non-display area of the substrate 110.

The timing controller 500 may be mounted on the control board 400. The timing controller 500 may perform signal processing on an image signal input thereto to generate a digital data signal and may supply the digital data signal to the data driving chip array part 300. That is, the timing controller 500 may receive the image signal and a timing synchronization signal supplied from the display driving system 700 through a user connector 510 provided on the control board 400. The timing controller 500 may align the image signal to generate the digital data signal matching a pixel arrangement structure of the display area DA, based on the timing synchronization signal and may supply the generated digital data signal to the data driving chip array part 300. According to an aspect, the timing controller 500 may supply the digital data signal, a reference clock, and a data start signal to the data driving chip array part 300 by using a high speed serial interface manner (for example, an embedded point to point interface (EPI) manner, a low-voltage differential signaling (LVDS) interface manner, or a mini LVDS interface manner).

Moreover, the timing controller 500 may generate the reference clock and the data start signal, based on the timing synchronization signal and may supply the reference clock and the data start signal to the data driving chip array part 300.

The power management circuit 600 may generate a transistor logic voltage, a ground voltage, a pixel driving voltage, and a plurality of reference gamma voltages, based on an input power supplied from a power supply of the display driving system 700. Each of the transistor logic voltage and the ground voltage may be used as a driving voltage for the timing controller 500 and the data driving chip array part 300, and the ground voltage and the pixel driving voltage may be applied to the data driving chip array part 300 and the plurality of pixels P. Also, the plurality of reference gamma voltages may be used for the data driving chip array part 300 to convert digital data into an analog data voltage.

The display driving system 700 may be connected to the user connector 510 of the control board 500 through a signal transfer member 710. The display driving system 700 may generate the image signal from a video source and may supply the image signal to the timing controller 500. Here, the image signal may be supplied to the timing controller 500 by using the high speed serial interface manner (for example, a V-by-One interface manner).

Figure 4:
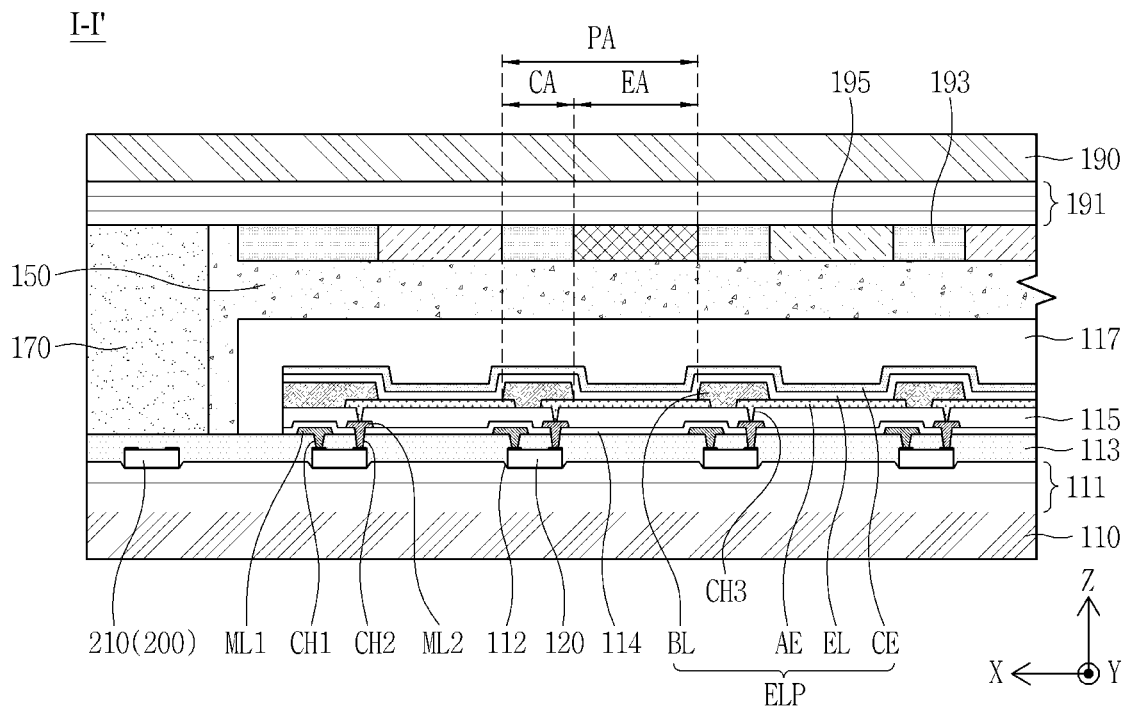
FIG. 4 is a cross-sectional view taken along line I-I' illustrated in FIG. 1.

FIG. 4 is a cross-sectional view taken along line I-I' illustrated in FIG. 1 and is a cross-sectional view illustrating adjacent pixels provided in the display panel illustrated in FIG. 1.

Referring to FIG. 4, a light emitting display apparatus according to an aspect of the present disclosure may include a substrate 110, a buffer layer 111, a pixel driving chip 120, a gate driving chip array part 200, a data driving chip array part 300, a first planarization layer 113, a line layer, a second planarization layer 115, an encapsulation layer 117, and a light emitting device E.

The substrate 110, a base substrate, may be formed of an insulating material such as glass, quartz, ceramic and plastic. The substrate 110 may include a plurality of pixel areas PA each including an emitting area EA and a circuit area CA.

The buffer layer 111 may be provided on the substrate 110. The buffer layer 111 may prevent water from penetrating into the plurality of light emitting devices E through the substrate 110. According to an aspect, the buffer layer 111 may include at least one inorganic layer including an inorganic material. For example, the buffer layer 111 may be a multilayer where one or more inorganic layers of silicon oxide ($SiO_x$), silicon nitride ($SiN_x$), silicon oxynitride (SiON), titanium oxide ($TiO_x$), and aluminum oxide ($AlO_x$) are alternately stacked.

Each of the plurality of pixel driving chips 120 may be mounted on the buffer layer 111 in the circuit area CA of each of the plurality of pixel areas PA through a chip mounting process. The plurality of pixel driving chips 120 may each have a size of 1 μm to 100 μm, but are not limited thereto. In other aspects, the plurality of pixel driving chips 120 may each have a size which is smaller than that of the emitting area EA other than an area occupied by the circuit area CA among the plurality of pixel areas PA. Each of the plurality of pixel driving chips 120, as described above, may include the first to fourth bumps B1 to B4, and thus, its repetitive description will be omitted.

The plurality of pixel driving chips 120 may be attached on the buffer layer 111 by an adhesive layer. Here, the adhesive layer may be provided on a rear surface (or a back surface) of each of the plurality of pixel driving chips 120. For example, in the chip mounting process, a vacuum adsorption nozzle may vacuum-adsorb the plurality of pixel driving chips 120 each including the rear surface (or the back surface) coated with the adhesive layer, and thus, the plurality of pixel driving chips 120 may be mounted on (or transferred onto) the buffer layer 111 in a corresponding pixel area PA.

Optionally, the plurality of pixel driving chips 120 may be respectively mounted on a plurality of concave portions 112 respectively provided in the circuit areas CA of the plurality of pixel areas PA.

Each of the plurality concave portions 112 may be recessed from a front surface of the buffer layer 111 disposed in a corresponding circuit area CA. For example, each of the plurality of concave portions 112 may have a groove shape or a cup shape which has a certain depth from the front surface of the buffer layer 111. Each of the plurality of concave portions 112 may individually accommodate and fix a corresponding pixel driving chip of the plurality of pixel driving chips 120, thereby minimizing increase in thickness of the light emitting display apparatus caused by a thickness (or a height) of each of the plurality of pixel driving chips 120. Each of the plurality of concave portions 112 may be concavely formed to have a shape corresponding to the plurality of pixel driving chips 120 and to have an inclined surface inclined at a certain angle, and thus, misalignment between the circuit areas CA and the pixel driving chips 120 is minimized in a mount process of mounting the plurality of pixel driving chips 120 on the buffer layer 111.

The plurality of pixel driving chips 120 according to an aspect may be respectively attached on floors of the plurality of concave portions 112 by the adhesive layer coated on each of the plurality of concave portions 112. According to another aspect, the plurality of pixel driving chips 120 may be respectively attached on the floors of the plurality of concave portions 112 by the adhesive layer coated on a whole surface of the buffer layer 111 including the plurality of concave portions 112.

The gate driving chip array part 200 may include first to $n^{th}$ gate driving chips 210 provided in the non-display area NDA of the substrate 110 and may be respectively connected to the first to $n^{th}$ gate lines GL. Like the pixel driving chips 120, each of the first to $n^{th}$ gate driving chips 210 may be mounted on (or transferred onto) a buffer layer 111 in a corresponding pixel area PA or may be disposed on a concave portion 112 provided in the buffer layer 111 in the corresponding pixel area PA by using an adhesive.

The data driving chip array part 300 may include first to $m^{th}$ data driving chip groups 3001 to 300m provided in the non-display area NDA of the substrate 110 and may be respectively connected to the first to $m^{th}$ data lines DL. Each of the first to $m^{th}$ data driving chip groups 3001 to 300m may include at least one data driving chip. Like the pixel driving chip 120, the data driving chip may be mounted on (or transferred onto) a buffer layer 111 in a corresponding pixel area PA or may be disposed on a concave portion 112 provided in the buffer layer 111 in the corresponding pixel area PA by using an adhesive.

The first planarization layer 113 may be disposed on a front surface of the substrate 110 to cover the plurality of pixel driving chips 120 and the first to $n^{th}$ gate driving chips 210. That is, the first planarization layer 113 may cover all of the buffer layer 111, the plurality of pixel driving chips 120, and the first to $n^{th}$ gate driving chips 210 disposed on the substrate 110 to provide a flat surface on the buffer layer 111, the plurality of pixel driving chips 120, and the first to $n^{th}$ gate driving chips 210 and to fix the plurality of pixel driving chips 120 and the first to $n^{th}$ gate driving chips 210. For example, the first planarization layer 113 may be formed of acryl resin, epoxy resin, phenolic resin, polyamide resin, polyimide resin, and/or the like.

The line layer may include first metal lines ML1, an insulation layer 114, and second metal lines ML2.

The first metal lines ML1 may be disposed on the first planarization layer 113 to pass through the display area DA in the first direction X or the second direction Y. The first metal lines ML1 may be used as the gate lines GL or the data lines DL and the pixel driving power lines PL. For example, the first metal lines ML1 may be used as the gate lines GL. In this case, the gate lines GL consisting of the first metal lines ML1 may extend or protrude to the circuit area CA of each pixel area PA and may be electrically connected to a first bump B1 of a corresponding pixel driving chip 120 through a first chip contact hole CH1 provided in the first planarization layer 113 to supply a gate pulse GP to the first bump B1 of the pixel driving chip 120.

The insulation layer 114 may be disposed on the substrate 110 to cover the first metal lines ML1. For example, the insulation layer 114 may be formed of silicon oxide ($SiO_x$), silicon nitride ($SiN_x$), silicon oxynitride (SiON), or a multilayer thereof.

The second metal lines ML2 may be disposed on the insulation layer 114 to pass through the display area DA in a direction intersecting the first metal lines ML1. The second metal lines ML2 may be used as the gate lines GL or as the data lines DL and the pixel driving power lines PL. For example, when the first metal lines ML1 is used as the gate lines, the second metal lines ML2 may be used as the data lines DL and the pixel driving power lines PL. In this case, the data lines DL consisting of the second metal lines ML2 may extend or protrude to the circuit area CA of each pixel area PA and may be electrically connected to a second bump B2 of a corresponding pixel driving chip 120 through a second chip contact hole CH2 provided in the first planarization layer 113 and the insulation layer 114 to supply a data voltage to the second bump B2 of the pixel driving chip 120. Also, the pixel driving power lines PL consisting of the second metal lines ML2 may extend or protrude to the circuit area CA of each pixel area PA and may be electrically connected to a third bump B3 of a corresponding pixel driving chip 120 through a third chip contact hole CH3 provided in the first planarization layer 113 and the insulation layer 114 to supply the pixel driving voltage VDD to the third bump B3 of the pixel driving chip 120. Here, the third chip contact hole CH3 may be formed along with the second chip contact hole CH2.

The first metal lines ML1 and the second metal lines ML2 may be formed of molybdenum (Mo), aluminum (Al), chrome (Cr), gold (Au), titanium (Ti), nickel (Ni), neodymium (Nd), copper (Cu) or an alloy thereof and may be formed of a single layer including at least one of the metals or the alloy or a multilayer which includes two or more layers and includes at least one of the metals or the alloy.

The second planarization layer 115 may be disposed on the substrate 110 to cover the line layer. That is, the second planarization layer 115 may be provided on the substrate 110 to cover the second metal lines ML2 and the insulation layer 114 and may provide a flat surface on the second metal lines ML2 and the insulation layer 114. For example, the second planarization layer 115 may be formed of acryl resin, epoxy resin, phenolic resin, polyamide resin, polyimide resin, and/or the like, but is not limited thereto.

The encapsulation layer 117 may be disposed on the substrate 110 to cover the light emitting device E. According to an aspect, the encapsulation layer 117 may prevent oxygen or water from penetrating into a light emitting layer EL of the light emitting device E. According to an aspect, the encapsulation layer 117 may include one inorganic material of silicon oxide ($SiO_x$), silicon nitride ($SiN_x$), silicon oxynitride (SiON), titanium oxide ($TiO_x$), and aluminum oxide ($AlO_x$).

Optionally, the encapsulation layer 117 may further include at least one organic layer. The organic layer may be formed to have a sufficient thickness, for preventing particles from penetrating into a light emitting device layer via the encapsulation layer 117. According to an aspect, the organic layer may be formed of one organic material of acryl resin, epoxy resin, phenolic resin, polyamide resin, polyimide resin, benzocyclobutene resin, and fluorine resin.

The plurality of light emitting devices E may each include a plurality of anode electrodes AE, the light emitting layer EL, a cathode electrode CE and a bank layer BL.

Each of the plurality of anode electrode AE may be individually patterned in each pixel area PA. Each of the plurality of anode electrodes AE may be electrically connected to a fourth bump B4 of a corresponding pixel driving chip 120 through an anode contact hole CH3 provided in a second planarization layer 115 in a corresponding pixel area PA and may be supplied with a driving current Id through the fourth bump B4 of the pixel driving chip 120. According to an aspect, the plurality of anode electrodes AE may each include a metal material which is high in reflectance. For example, each of the plurality of anode electrodes AE may be formed in a multilayer structure such as a stacked structure (Ti/Al/Ti) including aluminum (Al) and titanium (Ti), a stacked structure (ITO/Al/ITO) including aluminum (Al) and indium tin oxide (ITO), an APC (Al/Pd/Cu) alloy of Al, palladium (Pd), and Cu, or a stacked structure (ITO/APC/ITO) including an APC alloy and ITO, or may include a single-layer structure including one material or an alloy of two or more materials selected from among silver (Ag), aluminum (Al), molybdenum (Mo), gold (Au), magnesium (Mg), calcium (Ca), and barium (Ba).

The light emitting layer EL may be disposed in an emitting area EA on the plurality of anode electrodes AE.

The light emitting layer EL according to an aspect may include two or more sub light emitting layers for emitting white light. For example, the light emitting layer EL may include a first sub light emitting layer and a second sub light emitting layer for emitting white light based on a combination of first light and second light. Here, the first sub light emitting layer may emit the first light and may include one of a blue light emitting layer, a green light emitting layer, a red light emitting layer, a yellow light emitting layer, and a yellow-green light emitting layer. The second sub light emitting layer may include a light emitting layer, which emits light having a complementary color relationship with the first light, of a blue light emitting layer, a green light emitting layer, a red light emitting layer, a yellow light emitting layer, and a yellow-green light emitting layer. Since the light emitting layer EL emits white light, the light emitting layer EL may be provided on the substrate 110 to cover the plurality of anode electrodes AE and the bank layer BL without being individually patterned in each pixel area PA.

Additionally, the light emitting layer EL may additionally include one or more function layers for enhancing the emission efficiency and/or lifetime of the light emitting layer EL.

The cathode electrode CE may be disposed to cover the light emitting layer EL. In order for light emitted from the light emitting layer EL to be irradiated onto the opposite substrate 190, the cathode electrode CE according to an aspect may be formed of indium tin oxide (ITO) or indium zinc oxide (IZO), which is a transparent conductive material such as transparent conductive oxide (TCO).

The bank layer BL may define the emitting area EA in each of the plurality of pixel areas PA and may be referred to as a pixel defining layer (or an isolation layer). The bank layer BL may be provided on the second planarization layer 115 and in an edge of each of the plurality of anode electrodes AE and may overlap the circuit area CA of the pixel area PA to define the emitting area EA in each pixel area PA. For example, the bank layer BL may be formed of one organic material of acryl resin, epoxy resin, phenolic resin, polyamide resin, polyimide resin, benzocyclobutene resin, and fluorine resin. As another example, the bank layer BL may be formed of a photosensitive material including a black pigment. In this case, the bank layer BL may act as a light blocking pattern.

The opposite substrate 190 may be defined as a color filter array substrate. The opposite substrate 190 according to an aspect may include a barrier layer 191, a black matrix 193, and a color filter layer 195.

The barrier layer 191 may be provided one whole surface of the opposite substrate 190 facing the substrate 110 and may prevent penetration of external water or moisture. The barrier layer 191 according to an aspect may include at least one inorganic layer including an inorganic material. For example, the barrier layer 191 may be formed of a multilayer where one or more inorganic layers of silicon oxide ($SiO_x$), silicon nitride ($SiN_x$), silicon oxynitride (SiON), titanium oxide ($TiO_x$), and aluminum oxide ($AlO_x$) are alternately stacked.

The black matrix 193 may be disposed on the barrier layer 191 to overlap the bank layer BL provided on the substrate 110 and may define a plurality of transmissive parts respectively overlapping the emitting areas EA of the plurality of pixel areas PA. The black matrix 193 may be formed of a resin material or an opaque metal material such as chrome Cr or CrOx, or may be formed of a light absorbing material.

The color filter layer 195 may be disposed in each of the plurality of transmissive parts provided by the black matrix 193. The color filter layer 195 may include one of a red color filter, a green color filter, and a blue color filter. The red color filter, the green color filter, and the blue color filter may be repeatedly disposed in a first direction X.

Optionally, the color filter layer 195 may include a quantum dot which has a size enabling light of a predetermined color to be emitted and re-emits light according to light incident from the light emitting layer EL. Here, the quantum dot may be selected from among CdS, CdSe, CdTe, ZnS, ZnSe, GaAs, GaP, GaAs—P, Ga—Sb, InAs, InP, InSb, AlAs, AlP, AlSb, and the like. For example, the red color filter may include a quantum dot (for example, CdSe or InP) emitting red light, the green color filter may include a quantum dot (for example, CdZnSeS) emitting green light, and the blue color filter may include a quantum dot (for example, ZnSe) emitting blue light. As described above, when the color filter layer 195 includes a quantum point, a color reproduction rate increases.

The opposite substrate 190 may be opposite-bonded to the substrate 110 by the transparent adhesive layer 150. Here, the transparent adhesive layer 150 may be referred to as a filler. The transparent adhesive layer 150 according to an aspect may be formed of a material capable of being filling between the substrate 110 and the opposite substrate 190, and for example, may be formed of a transparent epoxy material capable of transmitting light, but the present disclosure is not limited thereto. The transparent adhesive layer 150 may be formed on the substrate 110 by a process such as an inkjet process, a slit coating process, or a screen printing process, but is not limited thereto. In other aspects, the transparent adhesive layer 150 may be provided on the opposite substrate 190.

Additionally, the light emitting display apparatus according to an aspect of the present disclosure may further include a dam pattern 170 which surrounds an outer portion of the transparent adhesive layer 150.

The dam pattern 170 may be provided in an edge of the opposite substrate 190 in a closed loop form. The dam pattern 170 according to an aspect may be provided in an edge of the barrier layer 191 provided on the opposite substrate 190 to have a certain height. The dam pattern 170 may block the spread or overflow of the transparent adhesive layer 150 and may bond the substrate 110 to the opposite substrate 190. The dam pattern 170 according to an aspect may be formed of a high-viscosity resin (for example, an epoxy material) capable of being cured by light such as ultraviolet (UV). Furthermore, the dam pattern 170 may be formed of an epoxy material including a getter material capable of adsorbing water and/or oxygen, but is not limited thereto. The dam pattern 170 may block penetration of external water and/or oxygen into a gap between the substrate 110 and the opposite substrate 190 bonded to each other to protect the light emitting layer EL from the external water and/or oxygen, thereby increasing the reliability of the light emitting layer EL and preventing the lifetime of the light emitting layer EL from being reduced by the water and/or oxygen.

Figure 5:
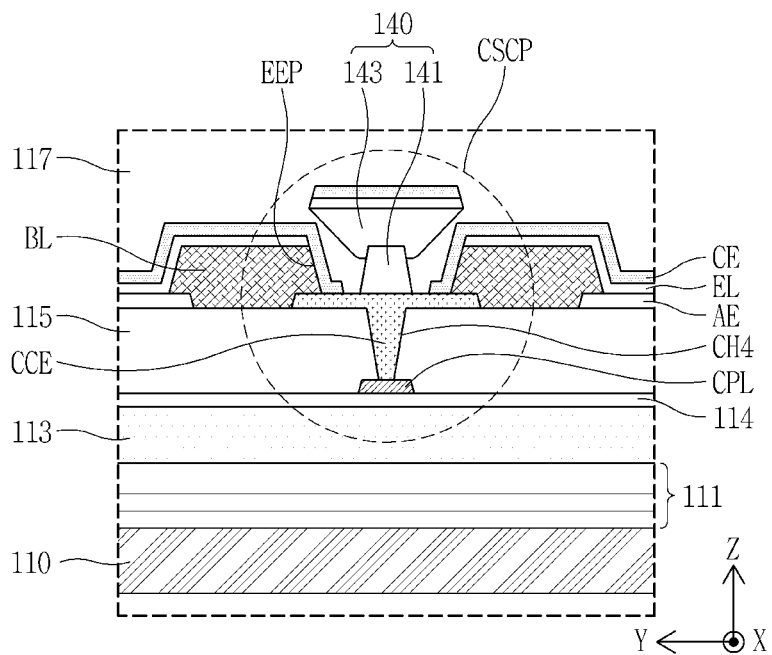
FIG. 5 is a diagram illustrating a connection structure between a cathode electrode and a cathode power line in a light emitting display apparatus according to an aspect of the present disclosure.

FIG. 5 is a diagram illustrating a connection structure between a cathode electrode and a cathode power line in a light emitting display apparatus according to an aspect of the present disclosure.

Referring to FIG. 5, a substrate 110 according to an aspect of the present disclosure may further include a plurality of cathode power lines which are disposed in parallel on an insulation layer 114 with at least one data line DL therebetween to pass through a display area DA.

The plurality of cathode power lines may receive a cathode voltage (for example, a ground voltage) from the power management circuit 600 through the pad part PP. The plurality of cathode power lines may be selected from among the second metal lines ML2. That is, some of the second metal lines ML2 may be used as a plurality of cathode power lines. The plurality of cathode power lines may be electrically connected to the cathode electrode CE in the display area DA. According to an aspect, a bank layer BL may include a plurality of cathode sub-contact parts CBP which are electrically connected to a plurality of cathode power lines CPL and a cathode electrode CE.

The plurality of cathode sub-contact part CBP may include a plurality of cathode connection electrodes CCE and a plurality of electrode exposure parts EEP.

The plurality of cathode connection electrodes CCE may be provided in an island shape on a second planarization layer 115 overlapping the bank layer BL and may be formed of the same material along with the anode electrode AE. An edge, other than a center, of each of the cathode connection electrodes CCE may be surrounded by the bank layer BL and may be spaced apart from and electrically disconnected from an adjacent anode electrode AE. Each of the cathode connection electrodes may be electrically connected to a corresponding cathode power line CPL through a cathode contact hole provided in the second planarization layer 115. In this case, one cathode power line CPL may be electrically connected to at least one cathode connection electrode CCE through at least one cathode contact hole.

The plurality of electrode exposure parts EEP may be disposed on the bank layer BL overlapping the plurality of cathode connection electrodes CCE and may respectively expose the plurality of cathode connection electrodes CCE. Thus, the cathode electrode CE may be electrically connected to each of the plurality of cathode connection electrodes CCE respectively exposed through the plurality of electrode exposure parts EEP and may be electrically connected to each of the plurality of cathode power lines CPL through the plurality of cathode connection electrodes CCE, and thus, may have a relatively low resistance. In particular, the cathode electrode CE may receive the cathode voltage from each of the plurality of cathode power lines CPL through the plurality of cathode connection electrodes CCE, thereby preventing non-uniform luminance caused by the voltage drop (IR drop) of the cathode voltage supplied to the cathode electrode CE.

According to an aspect, the substrate 110 may further include a partition wall part 140.

The partition wall part 140 may include a partition wall supporting part 141 disposed in each of the plurality of cathode connection electrodes CCE and a partition wall 143 disposed on the partition wall supporting part 141.

The partition wall supporting part 141 may be provided in the center of each of the plurality of cathode connection electrodes CCE to have a tapered structure having a trapezoidal cross-sectional surface.

The partition wall 143 may be provided on the partition wall supporting part 141 to have a reverse-tapered structure where a width of a lower surface is narrower than that of an upper surface, and may hide a corresponding electrode exposure part EEP. For example, the partition wall 143 may include a lower surface having a first width supported by the partition wall supporting part 141, an upper surface having a second width which is greater than the first width and is greater than or equal to a width of the electrode exposure part EEP, and an inclined surface which is disposed between the lower surface and the upper surface to hide the electrode exposure part EEP. The upper surface of the partition wall 143 may be provided to cover the electrode exposure part EEP and to one-dimensionally have a size which is greater than or equal to that of the electrode exposure part EEP, and thus, a light emitting material may be prevented from penetrating into the cathode connection electrode CCE exposed at the electrode exposure part EEP in a process of depositing the light emitting layer EL, whereby a cathode electrode material may be electrically connected to the cathode connection electrode CCE exposed at the electrode exposure part EEP in the process of depositing the light emitting layer EL. A penetration space (or a void) may be provided between the inclined surface of the partition wall 143 and the cathode connection electrode CCE exposed at the electrode exposure part EEP, and the edge of the cathode electrode CE may be electrically connected to the cathode connection electrode CCE exposed at the electrode exposure part EEP through the penetration space.

Figure 6:
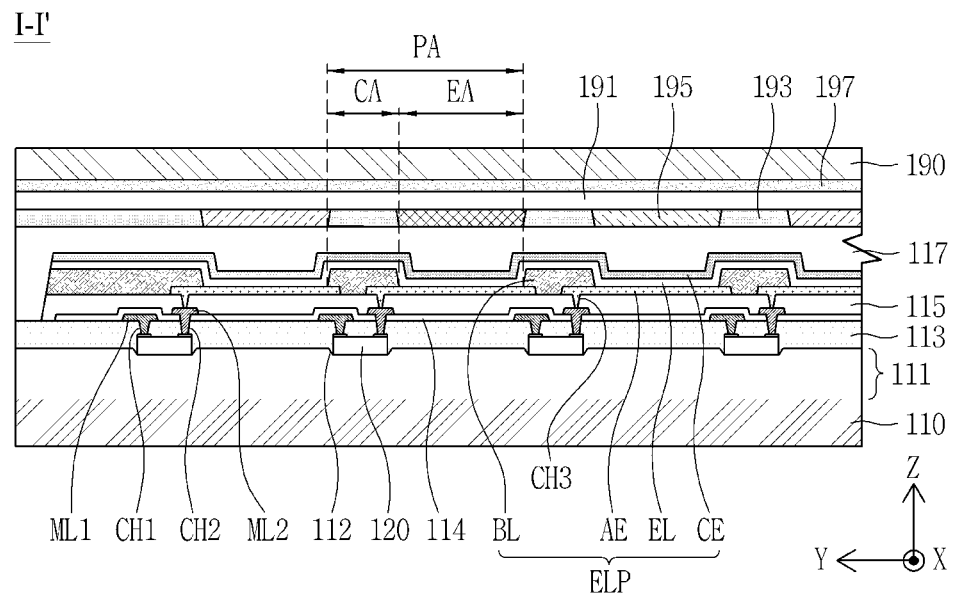
FIG. 6 is another cross-sectional view taken along line I-I' illustrated in FIG. 1.

FIG. 6 is another cross-sectional view taken along line I-I' illustrated in FIG. 1.

Referring to FIG. 6, the barrier layer 191, the black matrix 193, and the color filter layer 195 illustrated in FIG. 4 may be disposed on an encapsulation layer 117 of a substrate 110 without being disposed on an opposite substrate 190.

The black matrix 193 may be directly provided on a front surface of the encapsulation layer 117 to overlap a bank layer BL provided on the substrate 110 and may define a plurality of transmissive parts overlapping an emitting area EA of each pixel area PA.

The color filter layer 195 may be provided on the front surface of the encapsulation layer 117 exposed by each of the plurality of transmissive parts provided by the black matrix 193. Except for that the color filter layer 195 is provided on the encapsulation layer 117, the color filter layer 195 is the same as described above, and thus, its repetitive description will be omitted.

According to an aspect, the barrier layer 191 may be provided on the front surface of the encapsulation layer 117 to cover the color filter layer 195 and the black matrix 193, and thus, may provide a flat surface on the color filter layer 195 and the black matrix 193. In a case where the barrier layer 191 is formed through a high temperature process, the light emitting layer EL and the like disposed on the substrate 110 may be damaged by a high temperature. Accordingly, in order to prevent the damage of the light emitting layer EL vulnerable to a high temperature, the barrier layer 191 may be formed of an acryl-based, epoxy-based, or siloxane-based organic insulating material at a low temperature of 100 degrees C. or less.

The opposite substrate 190 may be attached on the front surface of the barrier layer 191 by an optical adhesive member 197 instead of the transparent adhesive layer 150. Here, the optical adhesive member 197 may be an optically clear adhesive (OCA), an optically clear resin (OCR), a pressure sensitive adhesive (PSA), or the like.

Since the opposite substrate 190 is attached on the front surface of the barrier layer 191 by the optical adhesive member 197, the above-described dam pattern 170 may be omitted.

Figure 7:
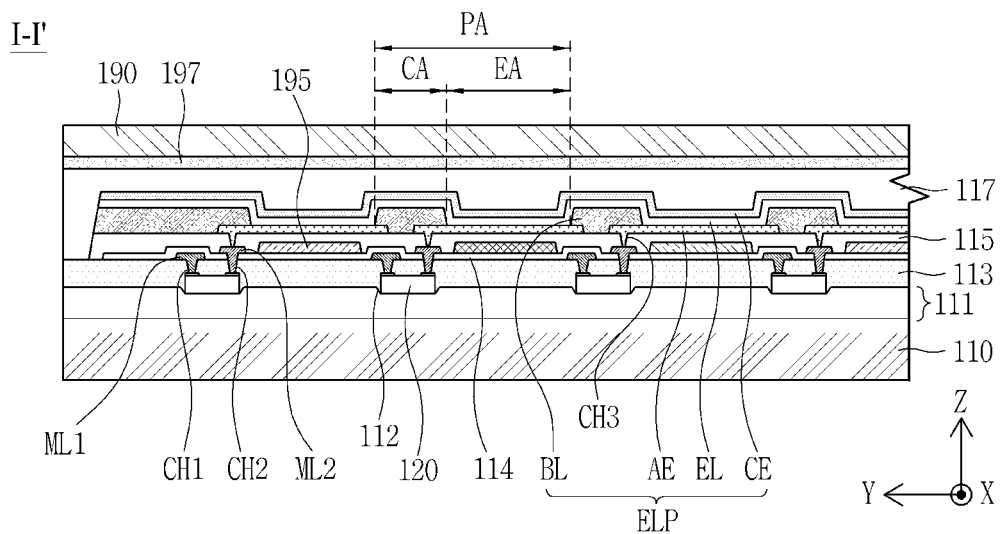
FIG. 7 is another cross-sectional view taken along line I-I' illustrated in FIG. 1.

FIG. 7 is another cross-sectional view taken along line I-I' illustrated in FIG. 1.

Referring to FIG. 7, the color filter layer 195 illustrated in FIG. 6 may be disposed between an anode electrode AE and a substrate 110 to overlap an emitting area EA of each pixel area PA. For example, the color filter layer 195 may be disposed on a second planarization layer 115 or a buffer layer 111, which overlaps the emitting area EA of each pixel area PA. In this case, the anode electrode AE may be formed of a transparent conductive material, and a cathode electrode CE may be formed of a metal material which is high in reflectance, whereby light emitted from a light emitting layer EL may sequentially pass through the color filter layer 195 and the substrate 110 and may be output to the outside. When such a disposition structure of the color filter layer 195 is applied, the opposite substrate 190 may be attached on an encapsulation layer 117 by an optical adhesive member 197, and the barrier layer 191 and the black matrix 193 may be omitted.

Figure 8:
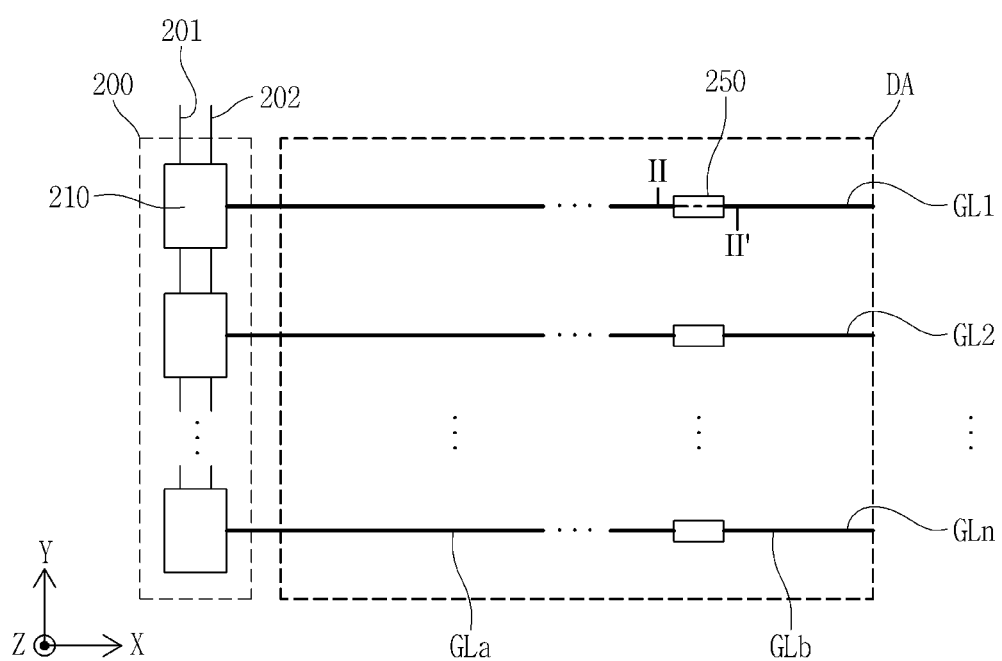
FIG. 8 is a diagram illustrating a gate driving chip array part illustrated in FIG. 2.
Figure 9:
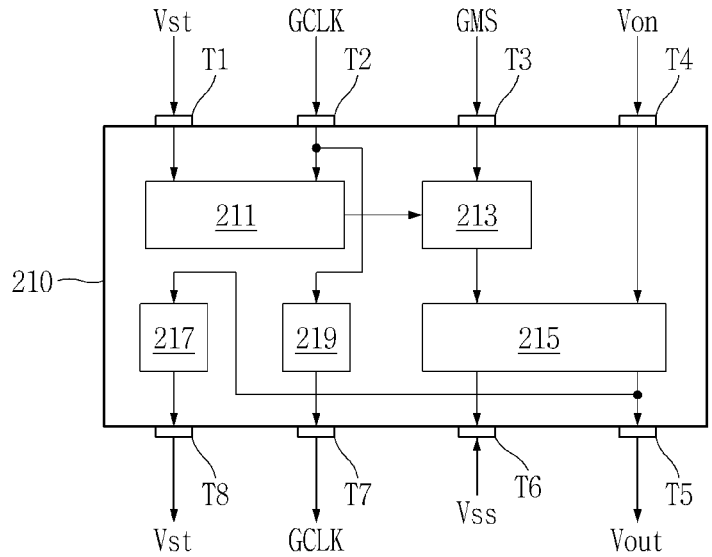
FIG. 9 is a diagram illustrating one gate driving chip illustrated in FIG. 8.
Figure 10:
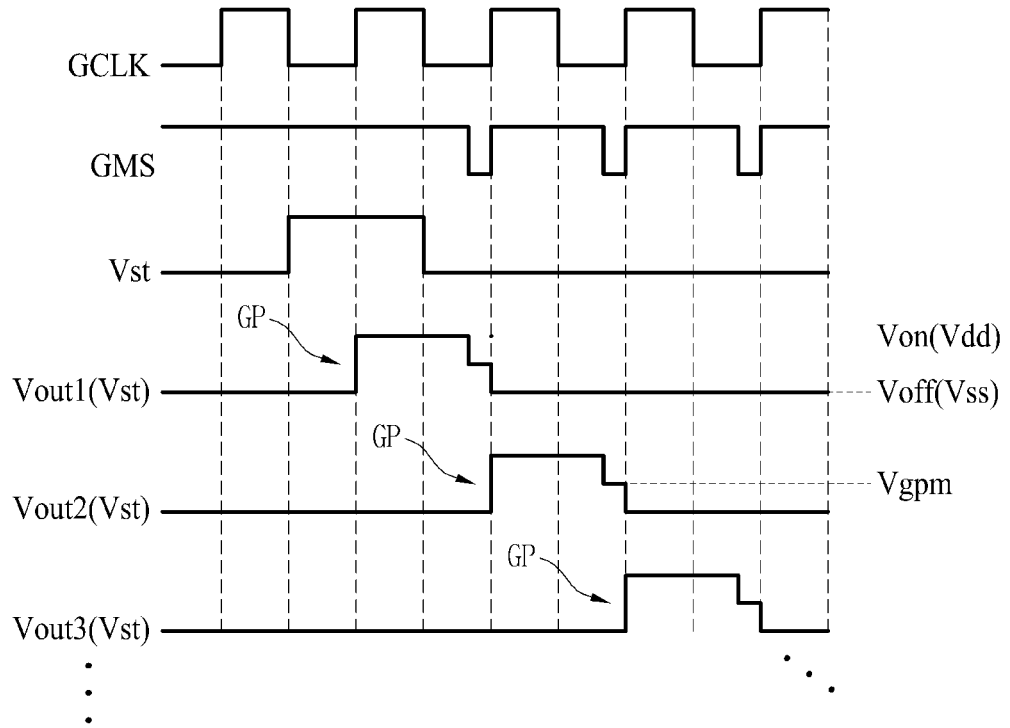
FIG. 10 is a waveform diagram showing input signals and output signals of the gate driving chip array part illustrated in FIG. 8.
Figure 11:
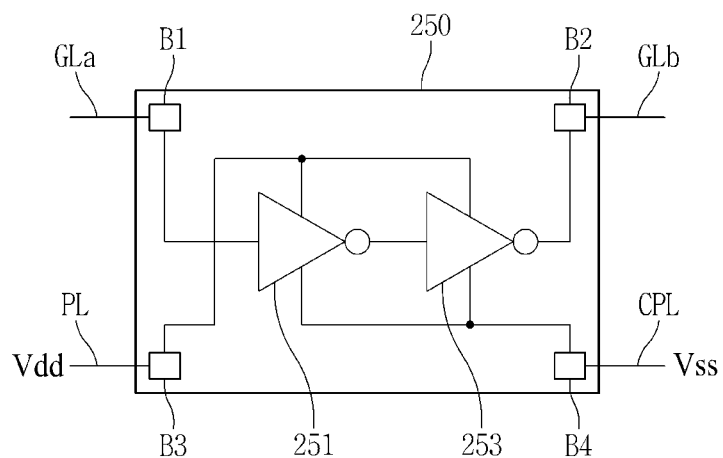
FIG. 11 is a diagram schematically illustrating a structure of the gate buffer chip illustrated in FIG. 8.
Figure 12:
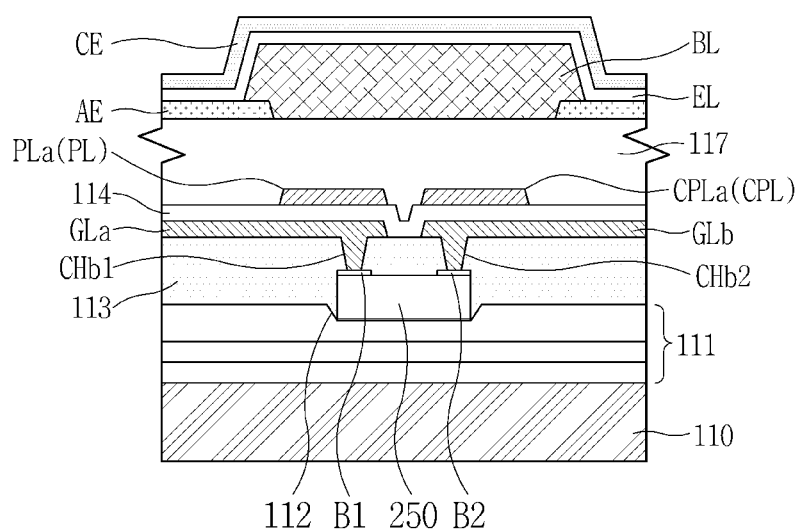
FIG. 12 is a cross-sectional view taken along line II-II' illustrated in FIG. 8.

FIG. 8 is a diagram illustrating a gate driving chip array part illustrated in FIG. 2. FIG. 9 is a diagram illustrating one gate driving chip illustrated in FIG. 8. FIG. 10 is a waveform diagram showing input signals and output signals of the gate driving chip array part illustrated in FIG. 8. FIG. 11 is a diagram schematically illustrating a structure of the gate buffer chip illustrated in FIG. 8. FIG. 12 is a cross-sectional view taken along line II-II' illustrated in FIG. 8.

Referring to FIGS. 8 to 12, the gate driving chip array part 200 may include first to $n^{th}$ gate driving chips 210 respectively connected to the first to $n^{th}$ gate lines GL1 to GLn. Here, the first to $n^{th}$ gate driving chips 210 may be a minimum-unit microchip or one chipset and may be a semiconductor packaging device which includes an IC including a plurality of transistors and has a fine size.

The first to $n^{th}$ gate driving chips 210 may be connected to one another in cascade and may operate in order to sequentially supply the gate pulse GP to the first to $n^{th}$ gate lines GL1 to GLn.

Each of the first to $n^{th}$ gate driving chips 210 may output a gate start signal Vst to a corresponding gate line GL as the gate pulse GP according to a gate clock GCLK and may supply an output signal Vout and the gate clock GCLK to a gate driving chip 210 disposed at a rear stage. Here, the gate start signal Vst may be supplied to the first gate driving chip 210 by a timing controller through a single gate start signal line 201, or the gate clock GLCK may be supplied to the first gate driving chip 210 by the timing controller through a single gate clock line 202.

According to an aspect, each of the first to $n^{th}$ gate driving chips 210 may include a shift register 211 and a level shifter 215. For example, each of the first to $n^{th}$ gate driving chips 210 may include first to eighth terminals T1 to T8.

The shift register 211 of the first gate driving chip 210 may shift the gate start signal Vst supplied through the first terminal T1 according to the gate clock GCLK supplied through the second terminal T2 and may output the shifted signal. For example, the shift register 211 may output a shift signal having a voltage level corresponding to that of the gate start signal Vst whenever the gate clock GCLK rises.

By using the gate-on voltage Von and the gate-off voltage Vss, the level shifter 215 of the first gate driving chip 210 may level-shift the shifted signal output from the shift register 211 to the gate pulse GP having the gate-on voltage Von or the gate-off voltage Vss and then outputs the gate pulse GP. The gate pulse GP may be supplied to the first gate line GL1 through the fifth terminal T5 and also may be supplied to the first terminal T1 of the second gate driving chip 210 through the eighth terminal T8 as a gate start signal Vst. Also, the gate clock GCLK supplied through the second terminal T2 of the first gate driving chip 210 may be supplied to the second terminal T2 of the second gate driving chip 210 through the seventh terminal T7. Here, the gate-on voltage Von, which is a pixel driving voltage provided from the power management circuit 600, may be supplied to the level shifter 215 through the fourth terminal T4, and the gate-off voltage Voff, which is a ground voltage provided from the power management circuit 600, may be supplied to the level shifter through the sixth terminal T6.

The shift registers of the second to $n^{th}$ gate driving chips 210 may receive, through the first terminal T1, the gate start signal Vst and the gate clock GCLK supplied from the eighth terminal T8 and the seventh terminal T7 of the gate driving chip 210 at a front stage, and may output the gate start signal Vst as a shifted signal according to the received gate clock GCLK.

By using the gate-on voltage Von and the gate-off voltage Vss, the level shifters 215 of the second to $n^{th}$ gate driving chips 210 may level-shift the shifted signal output from the shift register 211 to the gate pulses GP having the gate-on voltage Von or the gate-off voltage Vss and may output the gate pulse GP. Here, the gate pulse GP output from the level shifter 215 of each of the second to $n^{th}$ gate driving chips 210 may be supplied to a corresponding gate line and moreover, may be newly supplied as a gate start signal of the gate driving chip at a rear stage, and the gate clock GCLM supplied to each of the second to $n^{th}$ gate driving chips 210 may be newly supplied as the gate clock GCLK of the gate driving chip 210 at the rear stage.

Additionally, each of the first to $n^{th}$ gate driving chips 210 may further include a buffer 217 disposed between the eighth terminal T8 and an output terminal of the level shifter 215.

The buffer 217, which is an inverter-type buffer, may include an even number of inverters connected in series to each other and disposed between the eighth terminal T8 and the output terminal of the level shifter 215. By such a buffer 217 buffering the gate pulses GP output from the level shifter 215 using the gate-on voltage and the gate-off voltage Vss and outputting the buffered gate pulse SP to the eighth terminal T8, it is possible to minimize a deviation of falling times, by positions of the gate line, of the gate pulse GP caused by a total load of the gate line GL.

According to an aspect, the first to $n^{th}$ gate driving chips 210 may be connected in cascade to one other to deliver the gate start signal and the gate clock to the gate driving chip 210 disposed at a rear stage in a cascade manner. Thus, it is possible to reduce the number of lines needed for the gate driving chip array part 200.

According to an aspect, each of the first to $n^{th}$ gate driving chips 210 may further include a gate pulse modulator 213.

The gate pulse modulator 213 may modulate the gate-on voltage Von of the shifted signal output from the shift register 211 into a gate pulse modulation voltage Vgpm according to a gate modulation signal GMS supplied through the third terminal T3. Here, the gate modulation signal GMS, which is supplied by the timing controller to the gate pulse modulator 213 through the third terminal T3, may be a signal for preventing image quality from being degraded by a kick-back voltage generated when a switching transistor built in the pixel driving chip is turned off by the shift signal modulating a slope or time decreasing from the gate-on voltage Von to the gate pulse modulation voltage Vgpm. Thus, by the gate pulse modulator 213 modulating the gate-on voltage Von of the shift signal output from the shift register 211 into the gate pulse modulation voltage Vgpm according to the gate modulation signal, it is possible to prevent a deterioration in image quality due to the kick-back voltage.

Optionally, each of the first to $n^{th}$ gate driving chips 210 according to an aspect may further include a gate modulation signal generation unit configured not to receive the gate modulation signal GMS supplied through the third terminal T3 but to autonomously generate a gate modulation signal GMS on the basis of the gate clock GCKL input through the second terminal T2.

According to an aspect, the gate modulation signal generation unit may include an RC relay circuit. The RC delay circuit may delay the gate clock GCLK according to an RC time constant corresponding to a predetermined resistor value and capacitor value to generate the gate modulation signal GMS.

According to another aspect, the gate modulation signal generation unit may include an internal oscillator configured to generate an internal clock signal in response to the gate start signal Vst input through the first terminal T1 and an internal counter configured to count the internal clock signal to generate a gate modulation signal GMS.

Additionally, in each of the first to $n^{th}$ gate driving chips 210, an output time of the gate clock GCLK may be delayed from an output time of the gate pulse GP. That is, the output time of the gate clock GCLK output from the gate driving chip 210 may be set later than the output time of the gate pulse GP, thereby securing a stable rising time of the gate pulse GP supplied as a gate start signal of a rear stage gate driving chip 210. To this end, each of the first to $n^{th}$ gate driving chips 210 may further include a clock delayer 219. The clock delayer 219 may delay, by a predetermined time, the gate clock GLCK input through the second terminal T2 and may output a delayed gate clock GLCK through the seventh terminal T7. For example, the clock delay 219 may be implemented with an RC circuit using an RC time constant.

The light emitting display apparatus according to an aspect of the present disclosure may further include a gate buffer chip 250 mounted in the display area DA of the substrate and connected to the first to $n^{th}$ gate lines GL1 to GLn. Here, the gate buffer chip 250 may be a minimum-unit microchip or one chipset and may be a semiconductor packaging device which includes an IC including a plurality of transistors and has a fine size.

First, a light emitting display apparatus including a high-resolution large-area display panel may be driven at a high speed according to a frame frequency of 120 Hz or more. Thus, falling times, by positions of the gate line GL, of a gate pulse applied to one gate line GL may vary based on a total load of the gate lines GL, and thus, image quality is degraded due to a luminance deviation between a left portion and a right portion of the display panel. Thus, in the light emitting display apparatus according to the present disclosure, at least one gate buffer chip 250 may be disposed in each of the first to $n^{th}$ gate lines GL1 to GLn, thereby preventing image quality from be degraded due to a load deviation between the gate lines GL.

Each of the first to $n^{th}$ gate lines GL1 to GLn may be divided into first and second division lines GLa and GLb by a separate part disposed in the display area DA.

The gate buffer chip 250 may be mounted on the buffer layer 111 or the concave portion 112 provided in the buffer layer 111 to overlap the separate part located between the first and second division lines GLa and GLb of each of the first to $n^{th}$ gate lines GL1 to GLn, and may electrically connect the first and second division lines GLa and GLb, buffer a gate pulse supplied through the first division line GLa, and supply the buffered gate pulse to the second division line GLb.

According to an aspect, the gate buffer chip 250 may include first to fourth bumps B1 to B4, and first and second inverters 251 and 253 connected to each other in series.

The first bump B1 may be electrically connected to the first division line GLa to receive a gate pulse through the first division line GLa. For example, the first bump B1 may be electrically connected to the first division line GLa through a first bump contact hole CHb1 provided in the first planarization layer 113 overlapping the first division line GLa.

The second bump B2 may be electrically connected to the second division line GLb and may output, to the second division line GLb, the gate pulse output from an even number of inverters 251 and 253. For example, the second bump B2 may be electrically connected to the second division line GLb through a second bump contact hole CHb2 provided in the first planarization layer 113 overlapping the second division line GLb.

The third bump B3 may be electrically connected to an adjacent pixel driving power line PL to receive the pixel driving voltage VDD through the pixel driving power line PL. For example, the third bump B3 may be electrically connected to the pixel driving power line PL through a third bump contact hole provided in the first planarization layer 113 and an insulation layer 114 overlapping a protrusion electrode PLa protruding from the adjacent pixel driving power line PL.

The fourth bump B4 may be electrically connected to an adjacent cathode power line CPL and may receive a cathode voltage Vss through the cathode power line. For example, the fourth bump B4 may be electrically connected to the cathode power line CPL through a fourth bump contact hole provided in the first planarization layer 113 and an insulation layer 114 overlapping a protrusion electrode CPLa protruding from the adjacent cathode power line CPL. Optionally, the fourth bump B4 may be directly connected to the cathode electrode CE through the plurality of cathode connecting electrodes CCE without being electrically connected to the cathode power line CPL, based on a mount position of the gate buffer chip 250.

The first inverter 251 may logically invert a gate pulse supplied from the first division line GLa through the first bump B1 using the pixel driving voltage VDD supplied through the third bump B3 and the cathode voltage Vss supplied through the fourth bump B4 and may output a logically inverted gate pulse to the second inverter 253.

The second inverter 253 may logically re-invert the logically inverted gate pulse supplied from the first inverter 251 using the pixel driving voltage VDD supplied through the third bump B3 and the cathode voltage Vss supplied through the fourth bump B4 and may output the logically re-inverted gate pulse to the second bump B2.

Additionally, FIG. 8 shows that one gate buffer chip 250 is connected to each of the first to $n^{th}$ gate lines GL1 to GLn, but the present disclosure is not limited thereto. Two or more gate buffer chips 250 may be connected to each of the first to $n^{th}$ gate lines GL1 to GLn, based on a total load of the gate lines GL.

Such a gate buffer chip 250, which is an inverter-type buffer, may buffer a gate pulse supplied to corresponding gate lines GL1 to GLn using the pixel driving voltage VDD and the cathode power VSS. Thus, it is possible to minimize a deviation between falling times of location-specific gate pulses GP of the gate lines GL depending on the entire load of the gate lines GL and prevent image quality from being degraded due to a load deviation between the gate lines GL. In this case, a buffer embedded into each of the first to $n^{th}$ gate driving chips 210 may be omitted or have a relatively small size. Accordingly, according to an aspect, a gate buffer chip 250 may be disposed on each of the gate lines GL disposed on the display area DA, it is possible to decrease the size of each of the first to $n^{th}$ gate driving chips 210 and also to drive gate lines disposed on an ultra-large display panel by using only the first to $n^{th}$ gate driving chips 210.

The gate buffer chip 250 disposed in the display area DA may be connected to the cathode power line or the cathode electrode CE to receive the cathode voltage Vss so that the cathode voltage Vss supplied to the cathode electrode CE may change depending on the operation of the gate buffer chip 250. However, by stably and uniformly supplying the cathode power VSS to the cathode electrode CE through a plurality of cathode power line CPL, it is possible to prevent the cathode voltage Vss applied to the cathode electrode CE from being shifted according to the operation of the gate buffer chip 250.

Figure 13:
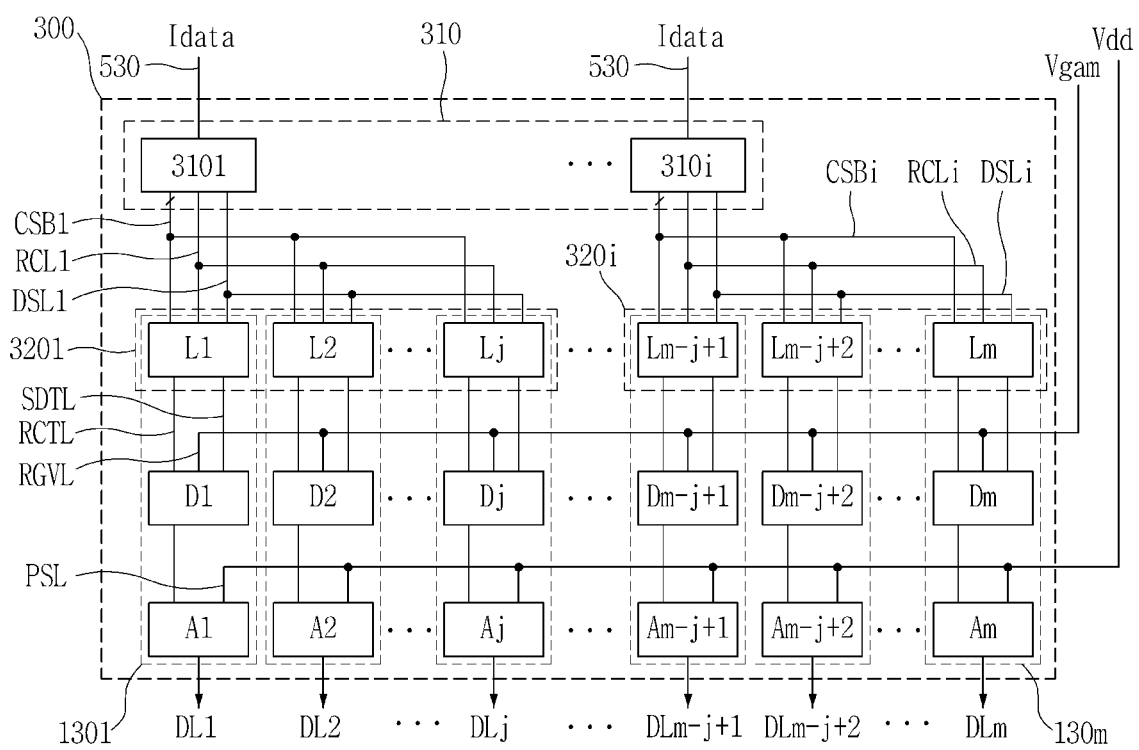
FIG. 13 is a diagram illustrating a data driving chip array part illustrated in FIG. 2.

FIG. 13 is a diagram illustrating the data driving chip array part illustrated in FIG. 2.

Referring to FIG. 13 in conjunction with FIGS. 1 and 2, the data driving chip array part 300 may include a data reception chip array 310 and first to $m^{th}$ data latch chips L1 to Lm. Here, each of the first to $m^{th}$ data latch chips L1 to Lm may be a minimum-unit microchip or one chipset and may be a semiconductor packaging device which includes an integrated circuit (IC) including a plurality of transistors and has a fine size.

The data reception chip array 310 may receive an input digital data signal Idata and may output pixel data for at least one horizontal line. The data reception chip array 310 may receive a digital data signal corresponding to a differential signal transmitted from the timing controller 500 according to a high-speed serial interface manner, for example, an embedded point to point interface (EPI) manner, a low-voltage differential signaling (LVDS) interface manner, or a Mini LVDS interface manner, may generate at least one horizontal line unit of pixel data on the basis of the received digital data signal, and may generate a reference clock and a data start signal from the differential signal.

According to an aspect, the data reception chip array 310 may include first to $i^{th}$ data reception chips 3101 to 310$i$ (where i is a natural number greater than or equal to two). Here, each of the first to $i^{th}$ data reception chips 3101 to 310$i$ may be a minimum-unit microchip or one chipset and may be a semiconductor packaging device which includes an IC including a plurality of transistors and has a fine size.

Each of the first to $i^{th}$ data reception chips 3101 to 310$i$ may individually receive digital data signals to be supplied to j pixels (where j is a natural number of 2 or greater) among differential signals transmitted from the timing controller 500 through a single interface cable 530, individually generate pixel data to be supplied to the j pixels on the basis of the received digital data signals, and individually generate a reference clock and a data start signal from the differential signals. For example, when the interface cable 530 has first to $i^{th}$ pairs, the first data reception chip 3101 may individually receive digital data signals corresponding to first to $i^{th}$ pixels from the differential signals transmitted from the timing controller 500 through the first pair of the interface cable 530, individually generate pixel data corresponding to the first to $j^{th}$ pixels on the basis of the received digital data signals, and individually generate a reference clock and a data start signal from the differential signals. Also, the $i^{th}$ data reception chip 310$i$ may individually receive digital data signals corresponding to m−j+1$^{th}$ to m$^{th}$ pixels from the differential signals transmitted from the timing controller 500 through the $i^{th}$ pair of the interface cable 530, individually generate pixel data corresponding to the m−j+1$^{th}$ to m$^{th}$ pixels on the basis of the received digital data signals, and individually generate a reference clock and a data start signal from the differential signals.

The first to $i^{th}$ data reception chips 3101 to 310$i$ may individually output pixel data through a serial data communication manner using first to $i^{th}$ common serial data buses CSB1 to CSBi each having a data bus corresponding to the number of bits of the pixel data, individually output the reference clock to first to $i^{th}$ common reference clock lines RCL1 to RCLi, and individually output the data start signal to first to $i^{th}$ data start signal lines DSL1 to DSLi. For example, the first data reception chip 3101 may transfer corresponding pixel data, a corresponding reference clock, and a corresponding data start signal through the first common serial data bus CSB1, the first common reference clock line RCL1, and the first data start signal line DSL1. Also, the $i^{th}$ data reception chip 310$i$ may transfer corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

According to an aspect, the data reception chip array 310 may be configured with only one data reception chip. That is, the first to $i^{th}$ data reception chips 3101 to 310$i$ may be integrated into a single integrated data reception chip.

Each of the first to m$^{th}$ data latch chips L1 to Lm may sample and latch (or hold) pixel data transmitted from the data reception chip array 310 according to the reference clock on the basis of the data start signal, and may output the received reference clock and the latched pixel data through a serial data communication manner.

The first to m$^{th}$ data latch chips L1 to Lm may be grouped into first to $i^{th}$ data latch groups 3201 to 320$i$, each of which consists of j data latch chips.

On a group basis, the data latch chips grouped into the first to $i^{th}$ data latch groups 3201 to 320$i$ may be connected to the first to $i^{th}$ common serial data buses CSB1 to CSBi in common. For example, each of the first to $j^{th}$ data latch chips L1 to Lj grouped into the first data latch group 3201 may receive corresponding pixel data, a corresponding reference clock, and a corresponding start signal through the first common serial data bus CSB1, the first common reference clock line RCL1, and the first data start signal line DSL1. Also, each of m−j+1$^{th}$ to m$^{th}$ data latch chips Lm−j+1 to Lm grouped into the $i^{th}$ data latch group 320$i$ may receive corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

When pixel data having a corresponding number of bits is sampled and latched, each of the first to m$^{th}$ data latch chips L1 to Lm may output the received reference clock and the latched pixel data through a serial data communication manner.

According to an aspect, each of the first to m$^{th}$ data latch chips L1 to Lm may include a latch circuit configured to sample and latch pixel data input through a corresponding common serial data bus CSB according to the reference clock in response to the data start signal, a counter circuit configured to count the reference clock and generate a data output signal, and a clock bypass circuit configured to bypass the received reference clock.

The first to m$^{th}$ digital-to-analog converter chips D1 to Dm may be respectively connected to the first to m$^{th}$ data latch chips L1 to Lm and may be connected to at least one reference gamma voltage supply line RGVL through which at least one reference gamma voltage Vgam is supplied from a power supply circuit. In this case, one of the digital-to-analog converter chips D1 to Dm may be connected to one of the data latch chips L1 to Lm through a single serial data transfer line SDTL and a single reference clock transfer line RCTL. The first to m$^{th}$ digital-to-analog converter chips D1 to Dm may receive and parallelize pixel data input from the corresponding data latch chips L1 to Lm through the serial data transfer line SDTL in a serial communication manner according to the reference clock transfer line RCTL supplied from the corresponding data latch chips L1 to Lm. Then, the first to m$^{th}$ digital-to-analog converter chips D1 to Dm may convert parallel pixel data into data voltages on the basis of reference gamma voltages supplied through the reference gamma voltage supply line RGVL and may output the data voltages.

According to an aspect, each of the first to m$^{th}$ digital-to-analog converter chips D1 to Dm may include a data parallelization circuit configured to receive and parallelize pixel data input in a serial data communication manner, according to a reference clock, a grayscale voltage generating circuit configured to distribute reference gamma voltages and generate a plurality of grayscale voltages corresponding to a plurality of grayscale values according to the number of bits of the pixel data, a clock counter configured to count the reference clock to generate a parallel data output signal, and a grayscale voltage selection unit configured to select, as a data voltage, one grayscale voltage corresponding to a grayscale value of parallel pixel data from among the plurality of grayscale voltages.

Optionally, the grayscale voltage generating circuit of each of the first to m$^{th}$ digital-to-analog converter chips D1 to Dm may distribute the pixel driving voltages Vdd supplied from the power management circuit 600 instead of the reference gamma voltages to generate a plurality of different grayscale voltages. In this case, the at least one reference gamma voltage supply line RGVL disposed in the non-display area of the substrate may be omitted, and thus it is possible to increase space utilization of the non-display area of the substrate According to an aspect, by receiving pixel data from the data latch chips L1 to Lm in a serial data communication manner, the first to m$^{th}$ digital-to-analog converter chips D1 to Dm may have a minimum number of terminals for receiving the pixel data and thus may be reduced in size. As the number of data transfer lines between the digital-to-analog converter chips D1 to Dm and the data latch chips L1 to Lm increases, it is possible to increase the space utilization of the non-display area of the substrate.

The first to m$^{th}$ data amp chips A1 to Am may be respectively connected to the first to m$^{th}$ digital analog converter chips D1 to Dm and may be respectively connected to the first to m$^{th}$ data lines DL1 to DLm. Also, the first to m$^{th}$ data amp chips A1 to Am may be connect to a pixel driving voltage supply line PSL through which the pixel driving voltage Vdd is supplied from the power management circuit 600 and may be connected to a ground voltage line through which a ground voltage is supplied from the power supply circuit 600. The first to $m^{th}$ data amp chips A1 to Am may buffer data voltages supplied from the corresponding digital-to-analog converter chips D1 to Dm on the basis of the pixel driving voltages Vdd and may supply the buffered data voltages to the corresponding data lines DL1 to DLm. For example, each of the first to $m^{th}$ data amp chips A1 to Am may buffer and output a data voltage on the basis of a gain value set according to a line load of a data line.

Additionally, one data reception chip, one data latch chip, and one digital-to-analog conversion chip for supplying data voltage to one data line may configure each of the data driving chip groups 1301 to 130m, which may be configured as a single data driving chip. In this case, the number of chips connected to each of the first to $m^{th}$ data lines DL1 to DLm may decrease by a factor of ⅓.

The data driving chip array part 300 may be mounted in the non-display area of the substrate to covert digital data input from the outside into a data voltage and supply the data voltage to the first to $m^{th}$ data lines DL1 to DLm. Accordingly, it is possible to omit a source printed circuit board and flexible circuit films provided in the display apparatus and thus to simplify the configuration of the display apparatus. Therefore, in the light emitting display apparatus according to the present disclosure, an area occupied by the data driving chip array part 300 in the non-display area of the substrate may be reduced, thereby minimizing an increase in bezel width of the display apparatus caused by mounting the data driving chip array part 300 on the substrate.

Figure 14:
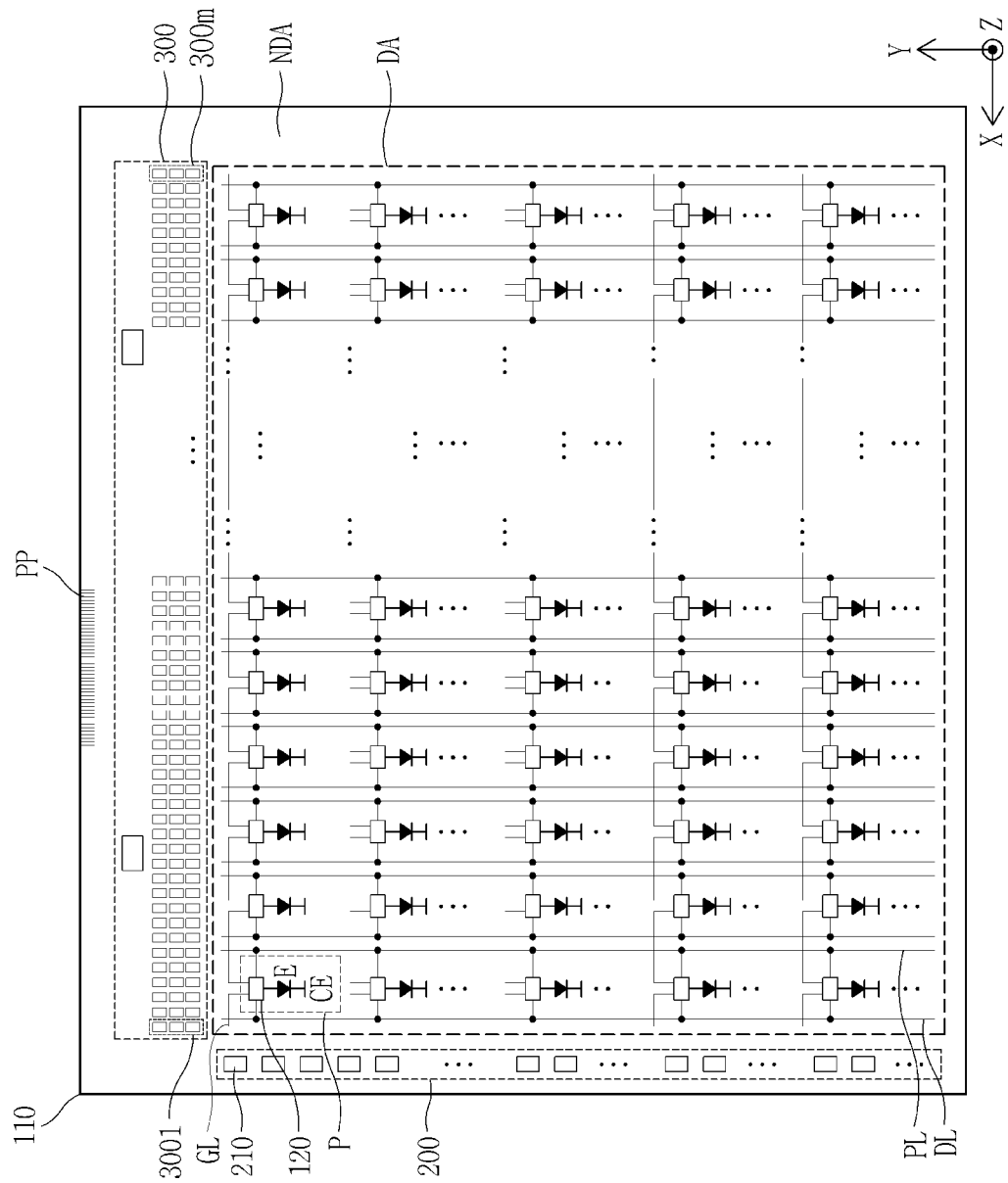
FIG. 14 is a diagram illustrating a light emitting display apparatus according to another aspect of the present disclosure.
Figure 15:
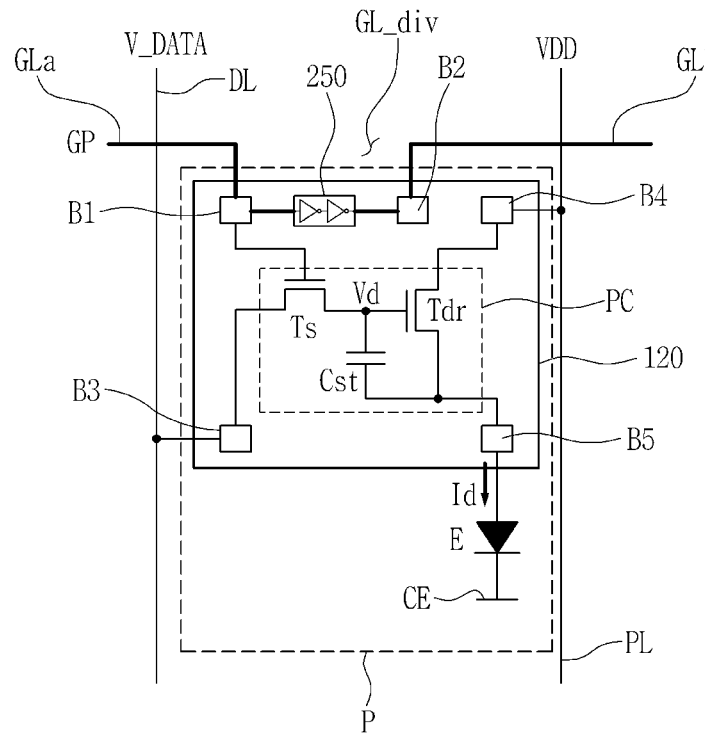
FIG. 15 is a diagram illustrating one pixel illustrated in FIG. 14.

FIG. 14 is a diagram illustrating a light emitting display apparatus according to another aspect of the present disclosure.

Referring to FIG. 14, a pixel driving chip 120 may include first to fifth bumps B1 to B5. The first bump B1 may be connected to a first division line GLa, and the second bump B2 may be connected to a second division line GLb. The third bump B3 may be connected to a data line DL, the fourth bump B4 may be connected to a pixel driving power line PL, and the fifth bump B5 may be connected to a light emitting device E.

According to an aspect, a gate buffer 250 may be embedded into the pixel driving chip 120. In detail, the gate buffer 250 may be connected between the first and second bumps B1 and B2 of the pixel driving chip 120. That is, the pixel driving chip 120 may include the first bump B1 connected to the first division line GLa of the gate line GL and the second bump B2 connected to the second division line GLb of the gate line, and moreover, may accommodate the gate buffer 250 disposed between the first and second bumps B1 and B2. The gate buffer 250 may be embedded into the pixel driving chip 120 of each of a plurality of pixels P and may buffer a gate pulse GP supplied through the first bump B1, thereby minimizing a deviation of falling times, by positions of the gate line GL, of the gate pulse GP caused by an RC load of the gate line GL to prevent image quality from being degraded by a load deviation of the gate line GL.

In this case, a buffer embedded into each of first to $n^{th}$ gate driving chips 120 may be omitted or may be configured to have a relatively small size. Therefore, in the light emitting display apparatus according to the present disclosure, since the gate buffer 250 is disposed in each of the gate lines GL arranged in the display area DA, a size of each of the first to $n^{th}$ gate driving chips 120 is reduced, and gate lines provided in a display panel having a super-large area may be driven by only the each of first to $n^{th}$ gate driving chips 120.

Figure 16:
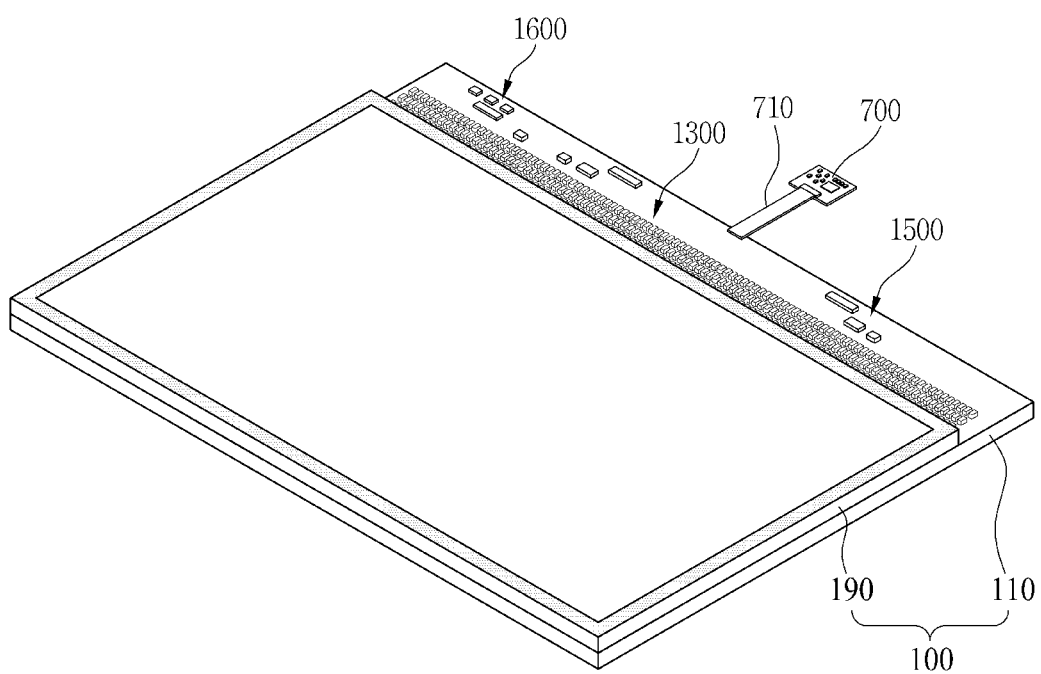
FIG. 16 is a diagram illustrating a light emitting display apparatus according to another aspect of the present disclosure.
Figure 17:
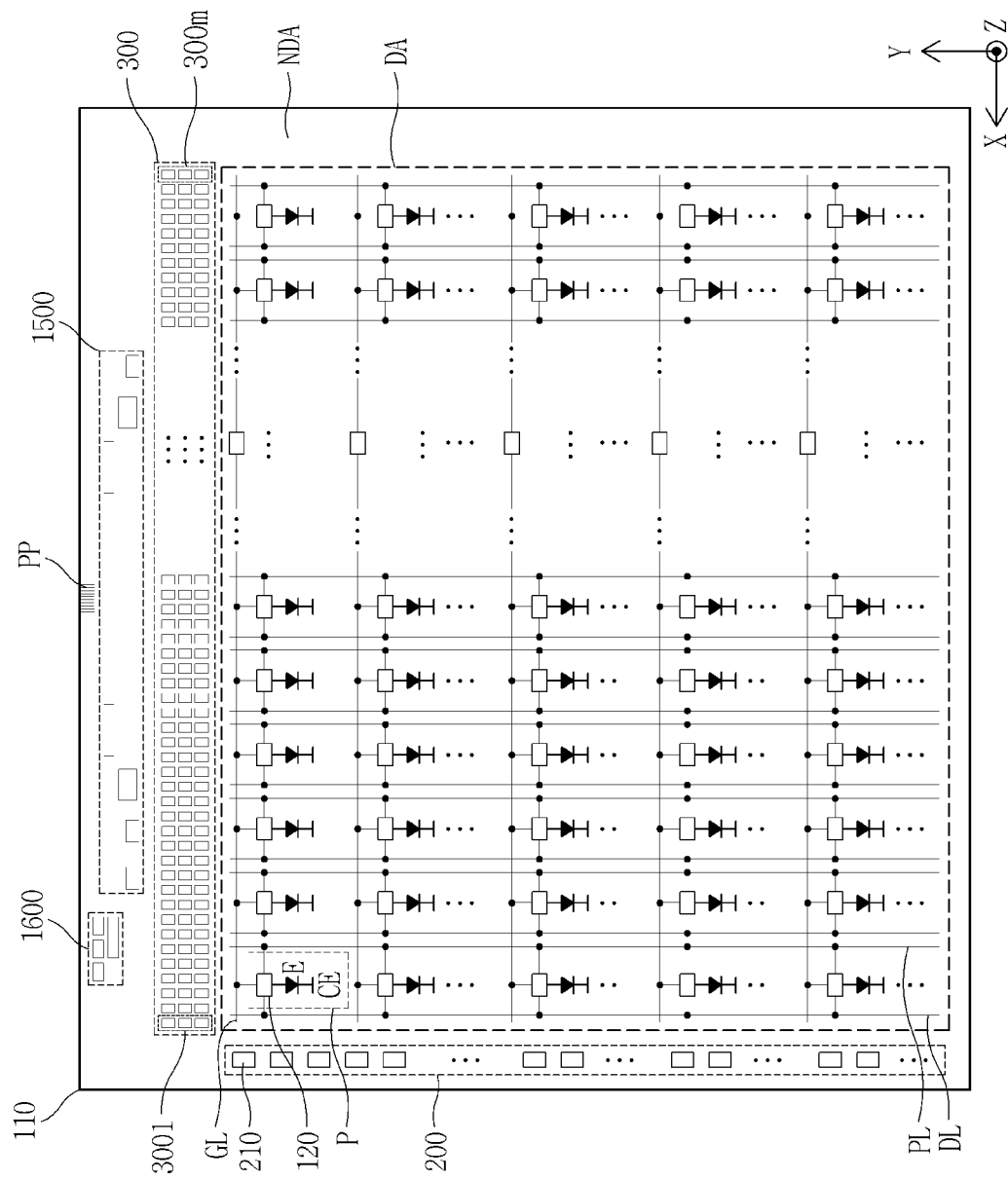
FIG. 17 is a diagram illustrating a substrate illustrated in FIG. 16.

FIG. 16 is a diagram illustrating a light emitting display apparatus according to another aspect of the present disclosure, and FIG. 17 is a diagram illustrating a substrate illustrated in FIG. 16. FIGS. 16 and 17 illustrate an example where each of the timing controller and the power management circuit of the light emitting display apparatus illustrated in FIGS. 1 to 15 is implemented as a microchip, and the microchip is mounted on a substrate of a display panel.

Referring to FIGS. 16 and 17, the light emitting display apparatus according to another aspect of the present disclosure may include a display panel 100, a data driving chip array part 1300, a timing controller chip array part 1500, and a power management chip array part 1600.

The display panel 100 may include a substrate 110 and an opposite substrate 190 and is the same as the display panel of the light emitting display apparatus according to an aspect of the present disclosure. Thus, like reference numerals refer to like elements, and repetitive descriptions of the same elements will be omitted.

The data driving chip array part 1300 may be mounted in a first non-display area (or an upper non-display area) of the substrate 110 and may convert pixel data, supplied from the timing controller chip array part 1500, into a data voltage to supply the data voltage to a corresponding one of first to $m^{th}$ data lines DL. For example, the data driving chip array part 1300 may include a plurality of data driving chips mounted in the first non-display area which is defined between the display area DA and a pad part PP of the substrate 110, and may supply a corresponding data voltage to each of the first to $m^{th}$ data lines DL.

The timing controller chip array part 1500 may be mounted in the first non-display area. The timing controller chip array part 1500 may generate a digital data signal on the basis of an image signal (or a differential signal) supplied from the display driving system 700 through the pad part PP and may provide the digital data signal to the data driving chip array part 1300. That is, the timing controller chip array part 1500 may receive the differential signal input through the pad part PP and may generate a frame-based digital data signal, reference clock, and data start signal from the differential signal. Also, the timing controller chip array part 1500 may perform image processing for image quality improvement on the digital data signal in units of frames and may provide the frame-based digital data signal, on which the image processing has been performed, to the data driving chip array part 1300 in units of at least one horizontal line.

The power management chip array part 1600 may be mounted in the non-display area of the substrate 110 and may output various voltages for displaying an image on each pixel P of the display panel 100 on the basis of an input power supplied from the display driving system 700 through the pad part PP disposed in the substrate 110. According to an aspect, the power management chip array part 1600 may generate a transistor logic voltage, pixel driving power, cathode power, and at least one reference gamma voltage on the basis of the input power.

Figure 18:
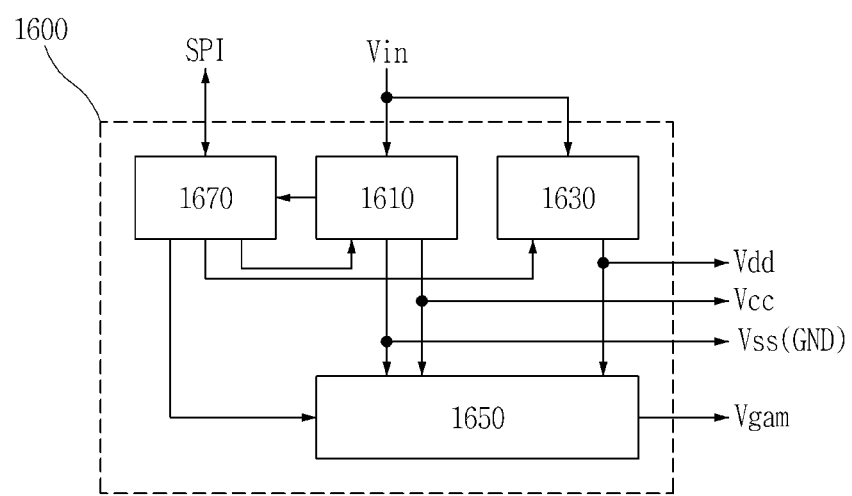
FIG. 18 is a block diagram illustrating a power management chip array part illustrated in FIGS. 16 and 17.

FIG. 18 is a block diagram illustrating a power management chip array part illustrated in FIGS. 16 and 17.

Referring to FIG. 18 in conjunction with FIGS. 16 and 17, the power management chip array part 1600 of the light emitting display apparatus may include a dc-dc converter chip array part which is mounted in the non-display area NDA of the substrate 110 and performs dc-dc conversion on an input power Vin received from the outside to output a converted input power.

The DC-DC converter chip array part may include a logic power chip 1610, a driving power chip 1630, and a gamma voltage generating chip 1650. Here, each of the logic power chip 1610, the driving power chip 1630, and the gamma voltage generating chip 1650 may be a minimum-unit microchip or one chipset and may be a semiconductor packaging device which includes an IC including a plurality of transistors and has a fine size.

The logic power chip 1610 may generate a transistor logic voltage Vcc based on the input power Vin and may provide the transistor logic voltage Vcc to a microchip that requires the transistor logic voltage Vcc. For example, the logic power chip 1610 may decrease (or step down) the input power Vin to generate a transistor logic voltage Vcc of 3.3V. Also, the logic power chip 1610 may generate a ground voltage GND based on the input power Vin and provides the ground voltage GND to a microchip that requires the ground voltage GND. Here, the ground voltage GND may be used as cathode power Vss supplied to the cathode electrode CE disposed on the display panel 100. According to an aspect, the logic power chip 1610 may be a dc-dc converter, for example, a step-down converter chip or a buck converter chip, but the present disclosure is not limited thereto.

The driving power chip 1630 may generate pixel driving power VDD based on the input power Vin and may provide the pixel driving power VDD to each pixel P and a microchip that require the pixel driving power VDD. For example, the driving power chip 1630 may generate pixel driving power VDD of 12V. According to an aspect, the driving power chip 1630 may be a dc-dc converter, for example, a step-up converter chip or a boost converter chip, but the present disclosure is not limited thereto.

The gamma voltage generating chip 1650 may receive the transistor logic voltage Vcc from the logic power chip 1610, receive the pixel driving power VDD from the driving power chip 1630, generate at least one reference voltage Vgam, and provide the reference gamma voltage Vgam to the data driving chip array part 1300. For example, through voltage distribution using a plurality of voltage divider resistors connected in series between a low potential terminal to which the transistor logic voltage Vcc is to be supplied and a high potential terminal to which the pixel drive power supply VDD is to be supplied, the gamma voltage generating chip 1650 may output, as the reference gamma voltage Vgam, a distribution voltage of a voltage distribution node between the plurality of voltage divider resistors.

According to an aspect, the power management chip array part 1600 may further include a serial communication chip 1670. Here, the serial communication chip 1670 may be a minimum-unit microchip or one chipset and may be a semiconductor packaging device which includes an IC including a plurality of transistors and has a fine size.

The serial communication chip 1670 may be connected to the display driving system 700 through a connector attached to a serial communication pad disposed at a side of the non-display area of the substrate 110, separately from the pad part PP disposed on the substrate 110. The serial communication chip 1670 may receive a voltage tuning signal supplied from the display driving system 700, restore the received voltage tuning signal back to voltage tuning data, and transfer the voltage tuning data to the dc-dc converter chip array part. For example, the voltage tuning signal may be a signal for tuning a gamma voltage. In this case, the voltage tuning data corresponding to the voltage tuning signal may be provided to the gamma voltage generating chip 1650, and the gamma voltage generating chip 1650 may tune a voltage level of the pixel driving power VDD supplied to the high potential terminal or tune resistance of at least one of the plurality of voltage divider resistors depending on the voltage tuning data.

Figure 19:
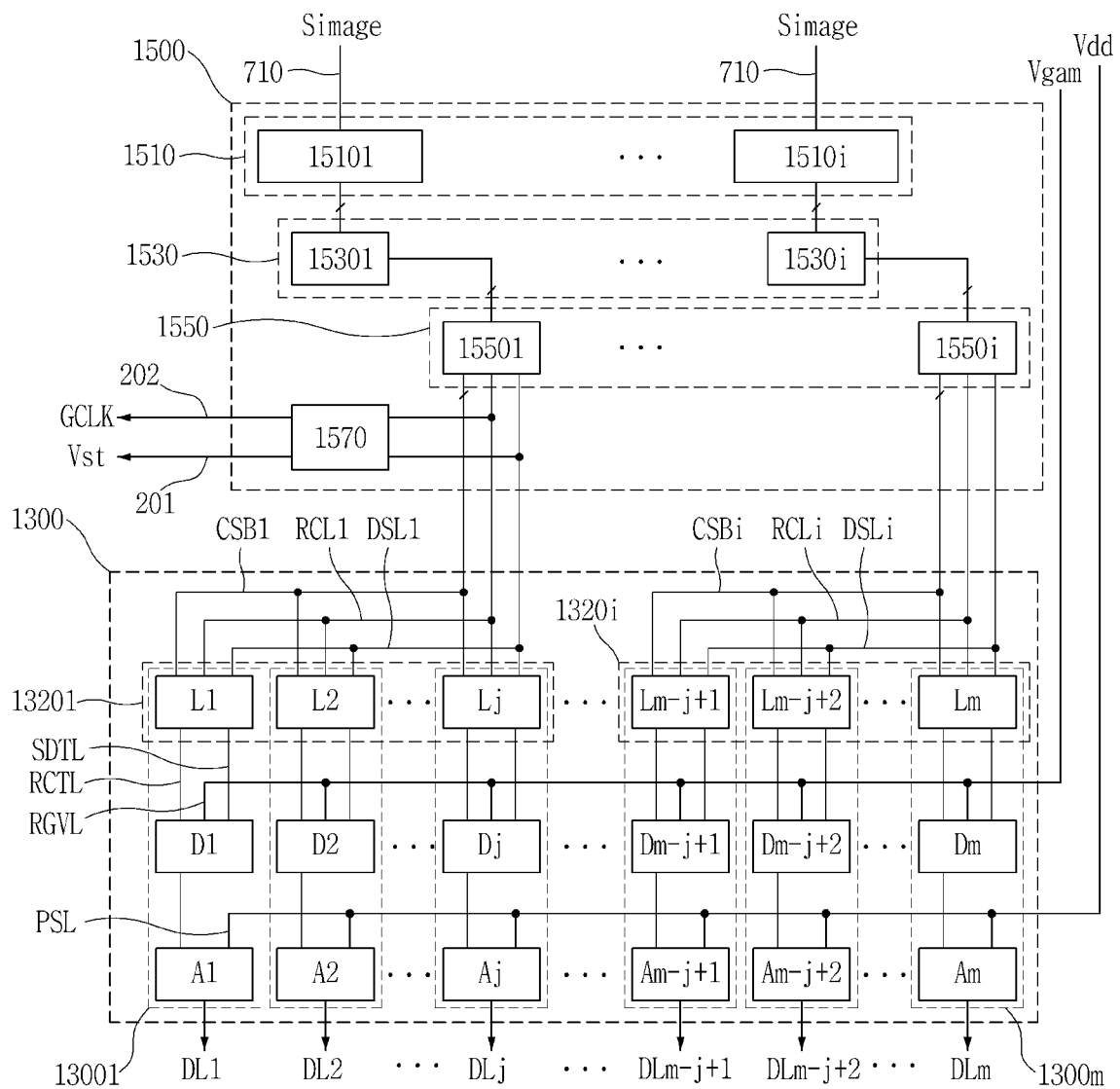
FIG. 19 is a diagram illustrating a timing controller chip array part and a data driving chip array part illustrated in FIGS. 16 and 17.

FIG. 19 is a diagram illustrating a timing controller chip array part and a data driving chip array part illustrated in FIGS. 16 and 17.

Referring to FIG. 19 in conjunction with FIGS. 16 and 17, an image signal reception chip array 1510 may generate a digital data signal, a reference clock, and a data start signal in one frame on the basis of an image signal Simage input from the display driving system 700 through the pad part PP. Here, the image signal Simage may be provided to the image signal reception chip array 1510 through a high-speed serial interface manner, for example, a V-by-One interface manner. In this case, the image signal reception chip array 1510 may receive a digital data signal corresponding to a differential signal for the image signal input from the display driving system 700 through the V-by-One interface manner, generate pixel data corresponding to at least one horizontal line on the basis of the received digital data signal, and generate a reference clock and a data start signal from the differential signal.

According to an aspect, the image signal reception chip array 1510 may include first to $i^{th}$ image signal reception chips 15101 to 1510$i$ (here, i is a natural number greater than or equal to two). Here, each of the first to $i^{th}$ image signal reception chips 15101 to 1510$i$ may be a minimum-unit microchip or one chipset and may be a semiconductor packaging device which includes an IC including a plurality of transistors and has a fine size.

In order to perform synchronization and data communication between the first to $i^{th}$ image signal reception chips 15101 to 1510$i$, the first image signal reception chip 15101 may be programmed as a master to control overall operations and functions in the image signal reception chip array 1510, and each of the second to $i^{th}$ image signal reception chips 15102 to 1510$i$ may be programmed as a slave to operate in synchronization with the first image signal reception chip 15101.

Each of the first to $i^{th}$ image signal reception chips 15101 to 1510$i$ may individually receive digital data signals to be supplied to j pixels among differential signals for the image signal S image transferred from the display driving system 700 through an interface cable 710, individually generate pixel data to be supplied to the j pixels on the basis of the received digital data signals, and individually generate a reference clock and a data start signal from the differential signals for the image signal Simage. For example, when the interface cable 710 has first to $i^{th}$ lanes, the first image signal reception chip 15101 may individually receive digital data signals corresponding to first to $i^{th}$ pixels from the differential signals for the image signal S image transmitted from the display driving system 700 through the first lane of the interface cable 710, individually generate pixel data corresponding to the first to $j^{th}$ pixels on the basis of the received digital data signals, and individually generate a reference clock and a data start signal from the differential signals for the image signal Simage. Also, the $i^{th}$ image signal reception chip 1510$i$ may individually receive digital data signals corresponding to m$-$j+1$^{th}$ to m$^{th}$ pixels from the differential signals for the image signal Simage transferred from the display driving system 700 through the $i^{th}$ lane of the interface cable 710, individually generate pixel data corresponding to the m$-$j+1$^{th}$ to m$^{th}$ pixels on the basis of the received digital data signals, and individually generate a reference clock and a data start signal from the differential signals for the image signal Simage.

Each of the first to $i^{th}$ image signal reception chips 15101 to 1510*i* may generate display setting data for a timing controller chip array part 1500 from a differential signal of a first frame input through the interface cable 710, store the display setting data in an internal memory, and generate a digital data signal, a reference clock, and a data start signal from differential signals for frames that are sequentially input through the interface cable 710.

According to an aspect, the image signal reception chip array 1510 may be configured with only one image signal reception chip. That is, the first to $i^{th}$ image signal reception chips 15101 to 1510*i* may be integrated into a single integrated image signal reception chip.

An image quality improvement chip array 1530 may receive a frame-based digital data signal from the image signal reception chip array 1510 and may execute a predetermined image quality improvement algorithm to improve the quality of an image corresponding to the frame-based digital data signal.

According to an aspect, the image quality improvement chip array 1530 may include first to $i^{th}$ image quality improvement chips 15301 to 1530*i* connected on a one-to-one basis to the first to $i^{th}$ image signal reception chips 15101 to 1510*i*. The first to $i^{th}$ image quality improvement chips 15301 to 1530*i* may receive digital data signals from the image signal reception chips 15101 to 1510*i* and may execute the predetermined image quality improvement algorithm to improve image quality according to the frame-based digital data signal. Here, each of the first to $i^{th}$ image quality improvement chips 15301 to 1530*i* may be a minimum-unit microchip or one chipset and may be a semiconductor packaging device which includes an IC including a plurality of transistors and has a fine size.

In order to perform synchronization and data communication between the first to $i^{th}$ image quality improvement chips 15301 to 1530*i*, the first image quality improvement chip 15301 may be programmed as a master to control overall operations and functions in the image quality improvement chip array 1530, and each of the second to $i^{th}$ image quality improvement chips 15302 to 1530*i* may be programmed as a slave to operate in synchronization with the first image quality improvement chip 15301.

When the image signal reception chip array 1510 is configured as a single integrated data reception chip, the first to $i^{th}$ image quality improvement chips 15301 to 1530*i* may be integrated into a single integrated image quality improvement chip connected to the integrated data reception chip.

On the basis of the reference clock and the data start signal provided from the image signal reception chip array 1510, a data control chip array 1550 may align a digital data signal with image quality improved by the image quality improvement chip array 1530 to generate and output pixel data corresponding to one horizontal line.

According to an aspect, the data control chip array 1550 may include first to $i^{th}$ data control chips 15501 to 1550*i* connected on a one-to-one basis to the first to $i^{th}$ image quality improvement chips 15301 to 1530*i*. The first to $i^{th}$ data control chips 15501 to 1550*i* may receive the digital data signal with improved image quality from the image quality improvement chips 15301 to 1530*i* and may align the digital data signal based on the reference clock and the data start signal provided from the image signal reception chip array 1510 to generate and output pixel data. Here, each of the first to $i^{th}$ data control chips 15501 to 1550*i* may be a minimum-unit microchip or one chipset and may be a semiconductor packaging device which includes an IC including a plurality of transistors and has a fine size.

In order to perform synchronization and data communication between the first to $i^{th}$ data control chips 15501 to 1550*i*, the first data control chip 15501 may be programmed as a master to control overall operations and functions in the data control chip array 1550, and each of the second to $i^{th}$ data control chips 15502 to 1550*i* may be programmed as a slave to operate in synchronization with the first data control chip 15501.

The first to $i^{th}$ data reception chips 15501 to 1550*i* may individually output pixel data through a serial data communication manner using first to $i^{th}$ common serial data buses CSB1 to CSBi each having a data bus corresponding to the number of bits of the pixel data, individually output the reference clock to first to $i^{th}$ common reference clock lines RCL1 to RCLi, and individually output the data start signal to first to $i^{th}$ data start signal lines DSL1 to DSLi. For example, the first image signal reception chip 15101 may transfer corresponding pixel data, a corresponding reference clock, and a corresponding data start signal through the first common serial data bus CSB1, the first common reference clock line RCL1, and the first data start signal line DSL1. Also, the $i^{th}$ image signal reception chip 1510*i* may transfer corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

When the image signal reception chip array 1510 is configured as a single integrated data reception chip and the image quality improvement chip array 1530 is configured as a single integrated image quality improvement chip, the first to $i^{th}$ data control chips 15501 to 1550*i* may be integrated into a single integrated data control chip connected to the integrated data reception chip.

A gate control chip 1570 may generate a gate clock GCLK and a gate start signal Vst on the basis of a reference clock output from the data control chip array 1550 and may provide the generated gate clock GCLK and gate start signal Vst to the gate driving chip array part 200. For example, the gate control chip 1570 may receive a data start signal and a reference clock from the data start signal line DSL1 and the common reference clock line RCL1 connected to the most adjacent data control chip 15501 among the first to $i^{th}$ data control chips of the data control chip array 1550, and may count a reference clock on the basis of the received data start signal to generate the gate clock GCLK and the gate start signal Vst. The gate start signal Vst may be provided to the first gate driving chip 210 of the gate driving chip array part 200 through a single gate start signal line 201 disposed on the substrate, and the gate clock GCLK may also be provided to the first gate driving chip 210 of the gate driving chip array part 200 through a single gate clock line 202 disposed on the substrate.

As described above, the timing controller chip array part 1500 may be mounted on the substrate 110 of the display panel 100 and may be connected to the display driving system 700 through a single interface cable 710, thereby simplifying a connection structure between the display panel 100 and the display driving system 700.

According to an aspect, the data driving chip array part 1300 of the light emitting display apparatus may include first to $m^{th}$ data latch chips L1 to Lm, first to $m^{th}$ digital-to-analog converter chips D1 to Dm, and first to $m^{th}$ data amp chips A1 to Am. Here, each of the first to $m^{th}$ data latch chips L1 to Lm, the first to $m^{th}$ digital-to-analog converter chips D1 to Dm, and the first to $m^{th}$ data amp chips A1 to Am may be a minimum-unit microchip or one chipset and may be a semiconductor packaging device which includes an IC including a plurality of transistors and has a fine size.

Each of the first to $m^{th}$ data latch chips L1 to Lm may samples and latch (or hold) pixel data transferred from the data control chip array 1550 of the timing controller chip array part 1500 according to the reference clock on the basis of the data start signal, and may output the received reference clock and the latched pixel data through a serial data communication manner.

The first to $m^{th}$ data latch chips L1 to Lm may be grouped into first to $i^{th}$ data latch groups 13201 to 1320$i$, each of which consists of j data latch chips. On a group basis, the first to $i^{th}$ data latch groups 13201 to 1320$i$ may be respectively connected to the first to $i^{th}$ data control chips 15501 to 1550$i$.

On a group basis, the data latch chips grouped into the first to $i^{th}$ data latch groups 13201 to 1320$i$ may be connected to the first to $i^{th}$ common serial data buses CSB1 to CSBi in common. For example, each of the first to $j^{th}$ data latch chips L1 to Lj grouped into the first data latch group 13201 may receive corresponding pixel data, a corresponding reference clock, and a corresponding start signal through the first common serial data bus CSB1, the first common reference clock line RCL1, and the first data start signal line DSL1. Also, each of m–j+1$^{th}$ to $m^{th}$ data latch chips Lm–j+1 to Lm grouped into the $i^{th}$ data latch group 1320$i$ may receive corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

When pixel data having a corresponding number of bits is sampled and latched, each of the first to $m^{th}$ data latch chips L1 to Lm may output the received reference clock and the latched pixel data through a serial data communication manner.

According to an aspect, each of the first to $m^{th}$ data latch chips L1 to Lm may include a latch circuit configured to sample and latch pixel data input through a corresponding common serial data bus CSB according to the reference clock in response to the data start signal, a counter circuit configured to count the reference clock and generate a data output signal, and a clock bypass circuit configured to bypass the received reference clock.

The first to $m^{th}$ digital-to-analog converter chips D1 to Dm may be respectively connected to the first to $m^{th}$ data latch chips L1 to Lm and may be connected to at least one reference gamma voltage supply line RGVL through which at least one reference gamma voltage Vgam is supplied from a power supply circuit. In this case, one of the digital-to-analog converter chips D1 to Dm may be connected to one of the data latch chips L1 to Lm through a single serial data transmission line SDTL and a single reference clock transmission line RCTL. The first to $m^{th}$ digital-to-analog converter chips D1 to Dm may receive and parallelize pixel data input from the corresponding data latch chips L1 to Lm through the serial data transmission line SDTL in a serial communication manner according to the reference clock transmission line RCTL supplied from the corresponding data latch chips L1 to Lm. Then, the first to $m^{th}$ digital-to-analog converter chips D1 to Dm may convert parallel pixel data into data voltages on the basis of the reference gamma voltages supplied through the reference gamma voltage supply line RGVL and may output the data voltages.

According to an aspect, each of the first to $m^{th}$ digital-to-analog converter chips D1 to Dm may include a data parallelization circuit configured to receive and parallelize pixel data input in a serial data communication manner, according to a reference clock, a grayscale voltage generating circuit configured to distribute reference gamma voltages and generate a plurality of grayscale voltages corresponding to a plurality of grayscale values according to the number of bits of the pixel data, and a clock counter configured to count the reference clock to generate a parallel data output signal.

Optionally, the grayscale voltage generating circuit of each of the first to $m^{th}$ digital-to-analog converter chips D1 to Dm may distribute pixel driving voltages Vdd supplied from the power supply circuit instead of the reference gamma voltages to generate a plurality of different grayscale voltages. In this case, the at least one reference gamma voltage supply line RGVL disposed in the non-display area of the substrate may be omitted, and thus, it is possible to increase space utilization of the non-display area of the substrate According to an aspect, by receiving pixel data from the data latch chips L1 to Lm in a serial data communication manner, the first to $m^{th}$ digital-to-analog converter chips D1 to Dm has a minimum number of terminals for receiving the pixel data and thus may be reduced in size. As the number of data transmission lines between the digital-to-analog converter chips D1 to Dm and the data latch chips L1 to Lm increases, it is possible to increase the space utilization of the non-display area of the substrate.

The first to $m^{th}$ data amp chips A1 to Am may be respectively connected to the first to $m^{th}$ digital analog converter chips D1 to Dm and may be respectively connected to the first to $m^{th}$ data lines DL1 to DLm. Also, the first to $m^{th}$ data amp chips A1 to Am may be connect to a pixel driving voltage supply line PSL through which the pixel driving voltage Vdd is supplied from the power supply circuit and are connected to a ground voltage line through which a ground voltage is supplied from the power supply circuit. The first to $m^{th}$ data amp chips A1 to Am may buffer data voltages supplied from the corresponding digital-to-analog converter chips D1 to Dm on the basis of the pixel driving voltages Vdd, and may supply the buffered data voltages to the corresponding data lines DL1 to DLm. For example, each of the first to $m^{th}$ data amp chips A1 to Am may buffer and output a data voltage on a gain value set according to a line load of a corresponding data line.

Additionally, one data latch chip, one digital-to-analog conversion chip, and one data amp chip for supplying a data voltage to one data line constitute each of the data driving chip groups 13001 to 1300$m$, which may be configured as a single data driving chip. In this case, the number of chips connected to each of the first to $m^{th}$ data lines DL1 to DLm may decrease by a factor of ⅓.

In the light emitting display apparatus according to another aspect, all circuits for allowing the display panel 100 to display an image corresponding to an image signal supplied from the display driving system 700 may be implemented as microchips mounted on the substrate 110, thereby obtaining the same effect as that of the light emitting display apparatus illustrated in FIGS. 1 to 15. Also, the microchips may be more easily simplified and integrated, and since the light emitting display apparatus is directly connected to the display driving system 700 through only one signal cable 710 or two signal cables, a connection structure between the light emitting display apparatus and the display driving system 700 may be simplified. Accordingly, the light emitting display apparatus according to another aspect may have a single plate shape, and thus, may have an enhanced sense of beauty in design.

As described above, in the aspects of the present disclosure, since the light emitting display apparatus includes the at least one gate buffer chip connected to the gate line, the light emitting display apparatus may buffer the gate pulse to remove a deviation of a falling time regardless of a distance between the gate driving circuit and the gate line, thereby preventing the occurrence of a luminance deviation between the left portion and the right portion of the display panel.

Moreover, in the aspects of the present disclosure, since the light emitting display apparatus includes the at least one gate buffer chip having a minimized size, the bezel area of the display panel is minimized.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus comprising:
    a substrate including a display area where a plurality of pixel areas is located and a non-display area surrounding the display area;
    first to $n^{th}$ gate lines passing through the display area of the substrate;
    a plurality of data lines passing through the display area of the substrate;
    a plurality of pixel driving power lines passing through the display area of the substrate;
    a gate driving chip array part including first to $n^{th}$ gate driving chips provided in the non-display area of the substrate and connected to the first to $n^{th}$ gate lines on a one-to-one basis;
    a plurality of pixels respectively provided in the plurality of pixel areas of the substrate and connected to an adjacent gate line, an adjacent data line, and an adjacent pixel driving power line; and
    a gate buffer provided in the display area of the substrate and connected to a corresponding gate line of the first to $n^{th}$ gate lines,
    wherein each of the first to $n^{th}$ gate driving chips outputs a gate start signal to a corresponding gate line as a gate pulse according to a gate clock and supplies an output signal and a gate clock output to a gate driving chip disposed at a next stage,
    wherein only the first gate driving chip of the first to $n^{th}$ gate driving chips is configured to receive the gate clock through a gate clock line, and each of the second to $n^{th}$ gate driving chips is configured to receive the gate clock and the output signal only by the second to $(n-1)^t$ gate driving chip disposed at a previous stage,
    wherein the gate clock line is only configured to be connected to the first gate driving chip connected only to the first gate line among the first to $n^{th}$ gate driving chips,
    wherein the first gate driving chip is connected to the first gate line, but is not connected to the second to $n^{th}$ gate lines,
    wherein the first to nth gate driving chips is cascade-connected to one another to deliver the gate start signal and the gate clock to the gate driving chip disposed at the next stage in a cascade manner,
    wherein one gate driving chip is only connected to one gate line,
    wherein the gate pulse output from the first gate driving chip is supplied to the first gate line and is simultaneously supplied to the second gate driving chip that is connected to the second gate line, and
    wherein in each of the first to nth gate driving chips, an output time of the gate clock is delayed from an output time of the gate pulse.

2. The light emitting display apparatus of claim 1, wherein the plurality of pixels each includes:
    a pixel driving chip connected to an adjacent gate line, an adjacent data line, and an adjacent pixel driving power line; and
    a light emitting device connected to the pixel driving chip.

3. The light emitting display apparatus of claim 2, wherein each of the first to $n^{th}$ gate lines includes first and second division lines divided by a separate part disposed in the display area, and the gate buffer is disposed in the separate part and is electrically connected between the first and second division lines.

4. The light emitting display apparatus of claim 3, wherein the gate buffer includes a buffer chip having a first bump connected to the first division line, a second bump connected to the second division line, a third bump connected to an adjacent pixel driving power line, and a fourth bump supplied with a cathode voltage.

5. The light emitting display apparatus of claim 4, wherein the gate buffer includes an even number of inverters serially connected between a first terminal and a second terminal thereof.

6. The light emitting display apparatus of claim 3, wherein the gate buffer is embedded into the pixel driving chip, and each of the first and second division lines is connected to the pixel driving chip.

7. The light emitting display apparatus of claim 6, wherein the pixel driving chip includes:
    a first bump connected to the first division line;
    a second bump connected to the second division line;
    a third bump connected to a corresponding data line;
    a fourth bump connected to a corresponding pixel driving power line; and
    a fifth bump connected to the light emitting device,
    wherein the gate buffer is connected between the first bump and the second bump.

8. The light emitting display apparatus of claim 2, further comprising:
    a first planarization layer disposed on the substrate to cover the plurality of pixel driving chips and the gate buffer;
    a line layer including the first to $n^{th}$ gate lines, the plurality of data lines, and the plurality of pixel driving power lines disposed on the first planarization layer;
    a second planarization layer covering the line layer; and
    an encapsulation layer disposed on the second planarization layer,
    wherein the light emitting device is disposed on the second planarization layer and is covered by the encapsulation layer.

9. The light emitting display apparatus of claim 8, wherein the light emitting device includes:
    a plurality of anode electrodes disposed in a corresponding pixel area on the second planarization layer and connected to a corresponding pixel driving chip;
    a bank layer disposed on the second planarization layer to define an emitting area on the plurality of anode electrodes;
    a light emitting layer disposed on the plurality of anode electrodes in the corresponding emitting area; and
    a cathode electrode disposed on the light emitting layer.

10. The light emitting display apparatus of claim 9, further comprising:
- at least one cathode power line passing through the display area of the substrate; and
- at least one cathode connection electrode disposed on the second planarization layer overlapping the bank layer and electrically connected to the at least one cathode power line,
- wherein the bank layer comprises an electrode exposure part exposing the at least one cathode connection electrode, and the cathode electrode is electrically connected to the at least one cathode connection electrode through the electrode exposure part.

11. The light emitting display apparatus of claim 10, further comprising a buffer layer covered by the first planarization layer and disposed on the substrate to support the plurality of pixel driving chips and the gate buffer,
- wherein the buffer layer comprises a plurality of concave portions respectively accommodating the plurality of pixel driving chips.

12. The light emitting display apparatus of claim 1, further comprising a data driving chip array part connected to the plurality of data lines.

13. The light emitting display apparatus of claim 12, wherein the data driving chip array part includes:
- a data reception chip array receiving a digital data signal input thereto to output pixel data corresponding to one horizontal line;
- a plurality of data latch chips connected to the data reception chip array;
- a plurality of digital-to-analog converter chips respectively connected to the plurality of data latch chips; and
- a plurality of data amp chips respectively connected to the plurality of digital-to-analog converters chips and respectively connected to the plurality of data lines.

14. The light emitting display apparatus of claim 1, further comprising:
- a data driving chip array part connected to the plurality of data lines; and
- a timing controller chip array part generating a digital data signal from an image signal input thereto, supplying the digital data signal to the data driving chip array part, and supplying the gate clock and the gate start signal to the gate driving chip array part,
- wherein the timing controller chip array part is provided in the non-display area of the substrate.

15. The light emitting display apparatus of claim 14, wherein the timing controller chip array part includes:
- an image signal reception chip array including at least one image signal reception chip generating a reference clock and a digital data signal of one frame, based on the image signal;
- at least one image quality improvement chip array improving quality of an image based on the digital data signal of the one frame;
- a data control chip array including at least one data control chip aligning a digital data signal with image quality improved by the image quality improvement chip array, based on the reference clock, to output pixel data corresponding to one horizontal line; and
- a gate control chip generating the gate clock and the gate start signal based on the reference clock to supply the gate clock and the gate start signal to the gate driving chip array part.

16. The light emitting display apparatus of claim 15, wherein the data driving chip array part includes:
- a plurality of data latch chips connected to the data control chip array;
- a plurality of digital-to-analog converter chips respectively connected to the plurality of data latch chips; and
- a plurality of data amp chips respectively connected to the plurality of digital-to-analog converters chips and respectively connected to the plurality of data lines.

17. A light emitting display apparatus a substrate including a display area where a plurality of pixel areas is located and a non-display area surrounding the display area, comprising:
- a pixel driving chip connected to an adjacent gate line, an adjacent data line, and an adjacent pixel driving power line;
- a light emitting device connected to the pixel driving chip;
- a plurality of gate lines passing through the display area;
- a plurality of data lines passing through the display area;
- a plurality of pixel driving power lines passing through the display area;
- a plurality of pixels disposed in the plurality of pixel areas and connected to an adjacent gate line, an adjacent data line, and an adjacent pixel driving power line; and
- a gate buffer chip embedded in the pixel driving chip and connected to a corresponding gate line of the plurality of gate lines.

18. The light emitting display apparatus of claim 17, wherein each of the plurality of gate lines includes first and second division lines divided by a separate part disposed in the display area, and the gate buffer is disposed in the separate part and is electrically connected between the first and second division lines.

19. The light emitting display apparatus of claim 18, wherein the buffer chip includes a first bump connected to the first division line, a second bump connected to the second division line, a third bump connected to an adjacent pixel driving power line, and a fourth bump supplied with a cathode voltage.

20. The light emitting display apparatus of claim 18, wherein each of the first and second division lines is connected to the pixel driving chip.

21. The light emitting display apparatus of claim 20, wherein the pixel driving chip includes:
- a first bump connected to the first division line;
- a second bump connected to the second division line;
- a third bump connected to a corresponding data line;
- a fourth bump connected to a corresponding pixel driving power line; and
- a fifth bump connected to the light emitting device,
- wherein the gate buffer is connected between the first bump and the second bump.

22. The light emitting display apparatus of claim 17, further comprising a gate driving chip array part including a plurality of gate driving chips provided in the non-display area of the substrate and respectively connected to the plurality of gate lines,
- wherein the plurality of gate driving chips is cascade-connected to one another.

23. The light emitting display apparatus of claim 22, further comprising a data driving chip array part connected to the plurality of data lines.

* * * * *